(12) United States Patent
Park et al.

(10) Patent No.: US 12,712,002 B2
(45) Date of Patent: Aug. 18, 2026

(54) BUFFER DIE AND STACKED MEMORY DEVICE INCLUDING THE SAME

(71) Applicant: SAMSUNG ELECTRONICS CO., LTD., Suwon-si (KR)

(72) Inventors: Chanjun Park, Suwon-si (KR); Minsu Jung, Suwon-si (KR); Beomyong Kil, Suwon-si (KR); Kyungmin Kim, Suwon-si (KR); Seungjun Bae, Suwon-si (KR); Yoochang Sung, Suwon-si (KR); Daihyun Lim, Suwon-si (KR); Hyunyoon Cho, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 68 days.

(21) Appl. No.: 18/895,006

(22) Filed: Sep. 24, 2024

(65) Prior Publication Data

US 2025/0356892 A1 Nov. 20, 2025

(30) Foreign Application Priority Data

May 20, 2024 (KR) ........................ 10-2024-0064914

(51) Int. Cl.
*G11C 7/22* (2006.01)
*G11C 29/02* (2006.01)
*H10W 90/00* (2026.01)

(52) U.S. Cl.
CPC ............ *G11C 7/222* (2013.01); *G11C 29/028* (2013.01); *H10W 90/00* (2026.01); *G11C 2207/2254* (2013.01)

(58) Field of Classification Search
CPC .................. G11C 7/222; G11C 29/028; G11C 2207/2254; G11C 7/1066; G11C 29/023;
(Continued)

(56) References Cited

U.S. PATENT DOCUMENTS 10,891,994 B2 1/2021 Kim
11,435,397 B2 9/2022 Choi et al.
(Continued)

FOREIGN PATENT DOCUMENTS

KR 10-2020-0052649 A 5/2020
KR 10-2020-0133631 A 11/2020
(Continued)

*Primary Examiner* — Amir Zarabian
*Assistant Examiner* — Minh Dinh
(74) *Attorney, Agent, or Firm* — Sughrue Mion, PLLC

(57) ABSTRACT

A buffer die provided in a wafer includes a write strobe signal generation circuit configured to, based on being enabled in a wafer level test on the buffer die, generate a first write strobe signal and a second write strobe signal having a phase difference of 180 degrees, a dividing and converting circuit configured to generate a plurality of divided clock signals having a phase difference of 90 degrees, a duty cycle adjusting circuit configured to generate a plurality of adjusted clock signals, a read strobe signal generation circuit configured to generate a first read strobe signal and a second read strobe signal having a phase difference of 180 degrees, a skew monitoring circuit configured to generate a first up/down signal, a trimming circuit is configured to generate a second up/down signal, generate a plurality of control code sets, and obtain a fuse calibration code.

20 Claims, 23 Drawing Sheets

(58) Field of Classification Search
CPC ........... G11C 7/1057; G11C 7/22; G11C 5/06; G11C 7/1051; G11C 7/1078; H10W 90/00; H10W 90/297; H10B 80/00
USPC ........................................................ 365/233.1
See application file for complete search history.

(56) References Cited

U.S. PATENT DOCUMENTS

| | | | | |
|---|---|---|---|---|
| 11,437,085 B2 | 9/2022 | Choi et al. | | |
| 11,522,550 B2 | 12/2022 | Kavala et al. | | |
| 11,568,916 B2 | 1/2023 | Choi et al. | | |
| 11,867,751 B2 | 1/2024 | Choi et al. | | |
| 11,948,621 B2 | 4/2024 | Jeong et al. | | |
| 12,047,082 B2 | 7/2024 | Kavala et al. | | |
| 2010/0238747 A1* | 9/2010 | Chen | G11C 29/028 | 365/194 |
| 2016/0204782 A1* | 7/2016 | Lee | G11C 29/028 | 365/189.17 |
| 2022/0075564 A1* | 3/2022 | Moon | G06F 3/0673 | |
| 2022/0406387 A1* | 12/2022 | Vigdorchik | G11C 7/1057 | |
| 2023/0377667 A1 | 11/2023 | Lee et al. | | |
| 2024/0012045 A1 | 1/2024 | Choi et al. | | |

FOREIGN PATENT DOCUMENTS

| | | |
|---|---|---|
| KR | 10-2021-0126821 A | 10/2021 |
| KR | 10-2021-0140875 A | 11/2021 |
| KR | 10-2023-0017711 A | 2/2023 |
| KR | 10-2023-0163271 A | 11/2023 |

* cited by examiner 200
270
275
FCD
CODE STORAGE2
FCD
273
280
AUTO CALIBRATION LOGIC
ACD
AC_EN
SS1
SS2
DELAY CONTROLLER
CCD1
CCD2
CCD3
CCD4
DCA1
DCA2
DCA3
DCA4
240a
240b
240c
240d
240
263
CODE STORAGE1
UP/DN2
271
DCM2
ACLKI
ACLKQ
ACLKIB
ACLKQB
CLOCK TREE
245
DCLKQB
DCLKIB
DCLKQ
DCLKI
DIVIDING & CONVERTING CIRCUIT
230
260
UP/DN1
261
DMC1
CLKI
CLKQ
CLKIB
CLKQB
PTD2
PTD1
RDQS GENERATION CIRCUIT
250
T11
T12
WDQS
WDQSB
SS2
SS1
TEN
WDQS GENERATION CIRCUIT
210
RDQSB
RDQS
T22
T21

Figure 4:
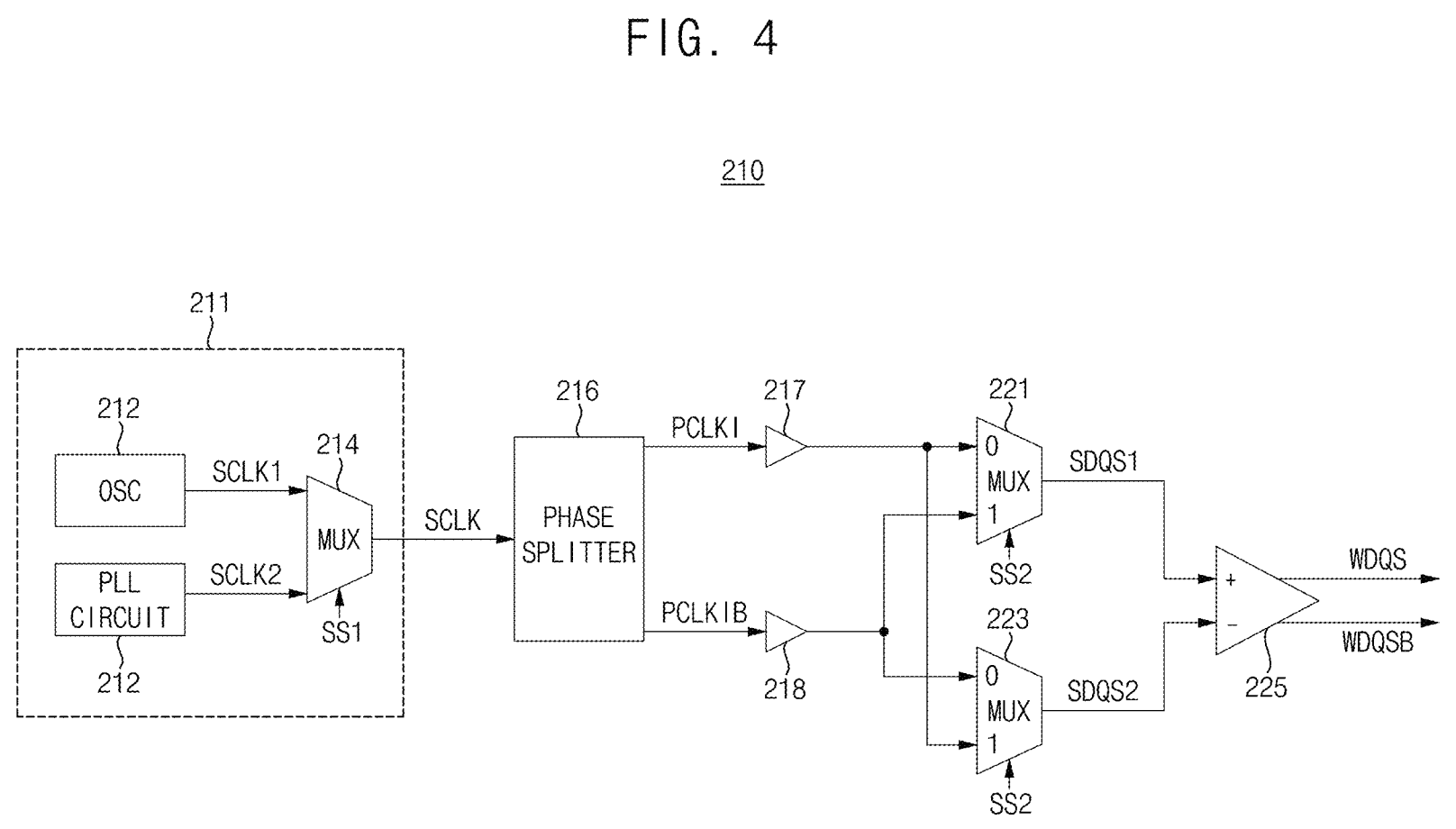

211
212 OSC
212 PLL CIRCUIT
SCLK1
SCLK2
214 MUX
SS1
SCLK
216 PHASE SPLITTER
PCLKI
PCLKIB
217
218
221 MUX 0 1
SS2
223 MUX 0 1
SS2
SDQS1
SDQS2
225 + -
WDQS
WDQSB

Figure 5:
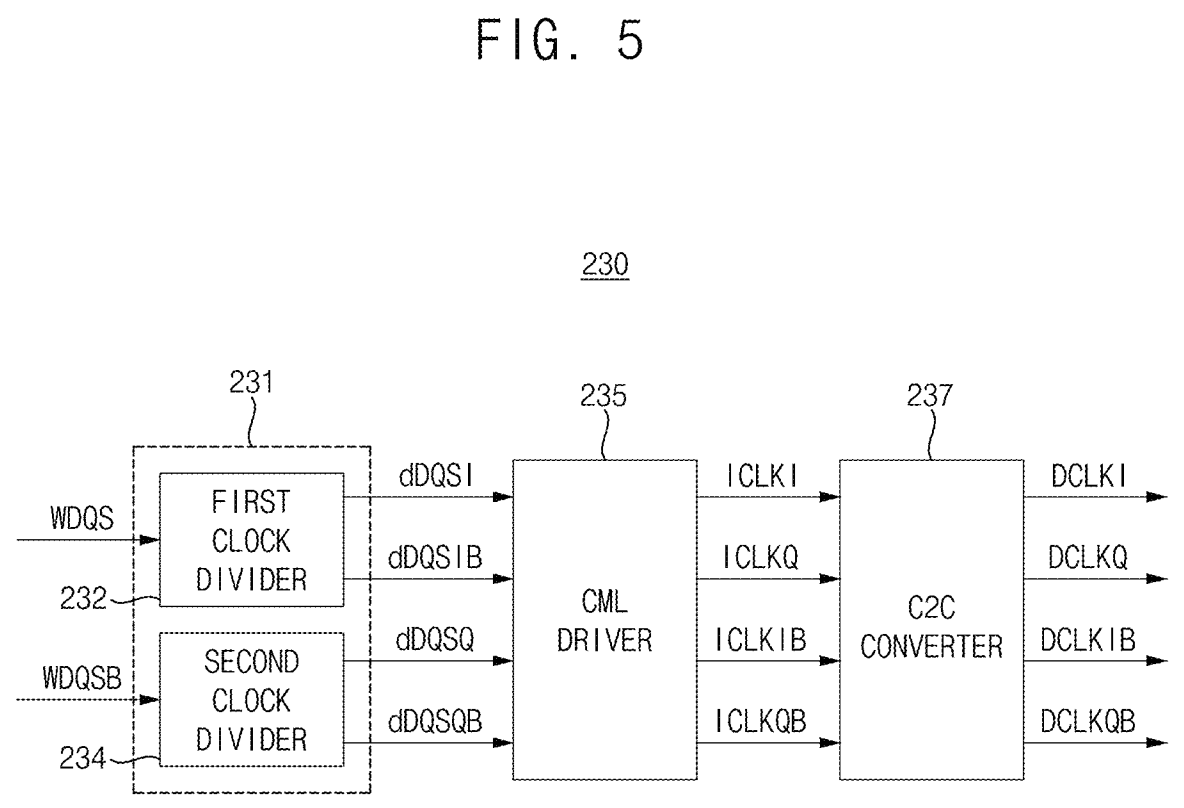

FIRST CLOCK DIVIDER

232

SECOND CLOCK DIVIDER

234

WDQS

WDQSB dDQSI dDQSIB dDQSQ dDQSQB

235

CML DRIVER

ICLKI

ICLKQ

ICLKIB

ICLKQB

237

C2C CONVERTER

DCLKI

DCLKQ

DCLKIB

DCLKQB

FIG. 6B 241a
241b
242a
242b
243a
243b
244a
244b
DCLKI
DCLKQ
DCLKIB
DCLKQB

FIG. 9

| PTD1 | PTD2 |
|---|---|
| HLHL | LHLH |
| LHLH | HLHL |
| HLLH | LHHL |
| LHHL | HLLH |
| HHLL | LLHH |
| LLHH | HHLL |

Default

FIG. 13

| SCD1 | | | CCD1 | | | | | | | |
|---|---|---|---|---|---|---|---|---|---|---|
| SCD11 | SCD12 | SCD13 | CCD11 | CCD12 | CCD13 | CCD14 | CCD15 | CCD16 | CCD17 | |
| 0 | 0 | 0 | 0 | 0 | 0 | 0 | 0 | 0 | 0 | |
| 0 | 0 | 1 | 1 | 0 | 0 | 0 | 0 | 0 | 0 | |
| 0 | 1 | 0 | 1 | 1 | 0 | 0 | 0 | 0 | 0 | |
| 0 | 1 | 1 | 1 | 1 | 1 | 0 | 0 | 0 | 0 | |
| 1 | 0 | 0 | 1 | 1 | 1 | 1 | 0 | 0 | 0 | → Default |
| 1 | 0 | 1 | 1 | 1 | 1 | 1 | 1 | 0 | 0 | |
| 1 | 1 | 0 | 1 | 1 | 1 | 1 | 1 | 1 | 0 | |
| 1 | 1 | 1 | 1 | 1 | 1 | 1 | 1 | 1 | 1 | |

FIG. 15

400a
CONTROL LOGIC CIRCUIT
COMMAND DECODER
MODE REGISTER
410
411a
412
iCMD
CTL1 CTL2
ADDRESS REGISTER
420
ADDR
REFRESH COUNTER
445
REF_ADDR
ROW_ADDR
RA MUX
440
RA
FIRST ROW DECODER
460
460a
460p
BANK CONTROL LOGIC
430
BANK_ADDR
COL_ADDR
CA LATCH
450
COL_ADDR'
FIRST BANK ARRAY
BTL
MC
WL
510
510a
510p
FIRST SENSE AMPLIFIERS
485
485a
485p
I/O GATING CIRCUIT
490
CTL1
FIRST COLUMN DECODER
470
470a
470p
CW
ECC ENGINE
590
CTL2
DTA
DATA I/O BUFFER
520a
DTA 1000
1100
1150
1140
1130
1120
1110
1112
1102
1300
1103
1400
1104
1102
1101
Core Die
Core Die
Core Die
Core Die
Buffer Die
DAB
PHY
1111
Package Substrate
1220
1220
1200
Memory Controller
PHY
SoC
Interposer

BUFFER DIE AND STACKED MEMORY DEVICE INCLUDING THE SAME

CROSS-REFERENCE TO RELATED APPLICATIONS

This application claims benefit of priority under 35 U.S.C. § 119 to Korean Patent Application No. 10-2024-0064914, filed on May 20, 2024, in the Korean Intellectual Property Office, the disclosure of which is incorporated by reference herein in its entirety.

BACKGROUND

1. Field

The present disclosure relates generally to memory devices, and more particularly, to a buffer die capable of transmitting and/or receiving data at a relatively high speed and with reduced power consumption, and a stacked memory device including the same.

2. Description of Related Art

Electronic devices such as, but not limited to, smartphones, graphics accelerators, and artificial intelligence (AI) accelerators, or the like may process data by using a memory device such as, but not limited to, a dynamic random access memory (DRAM), or the like. As the amount of data to be processed by the electronic devices increases, a memory device having a relatively high capacity and/or a relatively high bandwidth may be needed. That is, there exists an increasing need of a memory device, which may provide a wide input and/or output of a multi-channel interface, such as a high bandwidth memory capable of processing data at a relatively high speed.

When a memory device supports a relatively high bandwidth, data may be transmitted between a memory controller and the memory device at a relatively high speed. To secure the integrity of data when the data are transmitted at the relatively high speed, a data strobe signal may be exchanged between the memory controller and the memory device. The data strobe signal may toggle between a high level and a low level periodically while a data signal is transmitted between the memory controller and the memory device. In a case in which data are transmitted at the relatively high speed, a data strobe signal having a high frequency may be needed. However, the data exchange based on the data strobe signal having the high frequency may cause an increase in power consumption of the memory device, and as a result, input and/or output characteristics of the memory device may be degraded when skew (e.g., a change of timing and/or phase) occurs in the data strobe signal.

SUMMARY

One or more example embodiments of the present disclosure provide a buffer die capable of compensating for skew of a data strobe signal by monitoring a margin of the data strobe signal at a wafer level.

Further, one or more example embodiments of the present disclosure provide a stacked memory device including a buffer die capable of compensating for skew of a data strobe signal.

According to an aspect of the present disclosure, a buffer die provided in a wafer includes a write strobe signal generation circuit, a dividing and converting circuit, a duty cycle adjusting circuit, a read strobe signal generation circuit, a skew monitoring circuit, and a trimming circuit. The write strobe signal generation circuit is configured to, based on being enabled in a wafer level test on the buffer die, generate a first write strobe signal and a second write strobe signal having a first phase difference of 180 degrees from the first write strobe signal. The dividing and converting circuit is configured to generate a plurality of divided clock signals including a first divided clock signal, a second divided clock signal, a third divided clock signal, and a fourth divided clock signal. The plurality of divided clock signals have a second phase difference of 90 degrees with respect to each other. The generating of the plurality of divided clock signals includes dividing the first write strobe signal and the second write strobe signal, and converting one or more levels of the divided write strobe signals. The duty cycle adjusting circuit is configured to generate a plurality of adjusted clock signals including a first adjusted clock signal, a second adjusted clock signal, a third adjusted clock signal, and a fourth adjusted clock signal. The generating of the plurality of adjusted clock signals includes adjusting a duty cycle of each of the plurality of divided clock signals based on a corresponding control code set of a plurality of control code sets including a first control code set, a second control code set, a third control code set, and a fourth control code set. The read strobe signal generation circuit is configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree. The skew monitoring circuit is configured to generate a first up/down signal by monitoring a first duty cycle of the first read strobe signal and a second duty cycle of the second read strobe signal. The trimming circuit is configured to generate a second up/down signal by monitoring duty cycles of the plurality of read clock signals, generate the plurality of control code sets based on at least one of an auto calibration code or a fuse calibration code, and obtain, from an external test device, the fuse calibration code. The auto calibration code is generated based on the first up/down signal. The fuse calibration code has been generated based on the first up/down signal and the second up/down signal.

According to an aspect of the present disclosure, a stacked memory device includes a buffer die and a plurality of core dies stacked on the buffer die. The buffer die includes an interface circuit configured to communicate with an external host device. The plurality of core dies are coupled to the buffer die through a plurality of through silicon vias. The interface circuit is configured to receive, from the external host device, a first write strobe signal and a second write strobe signal having a first phase difference of 180 degrees from the first write strobe signal. The interface circuit includes a dividing and converting circuit, a duty cycle adjusting circuit, a read strobe signal generation circuit, a skew monitoring circuit, and a trimming circuit. The dividing and converting circuit is configured to generate a plurality of divided clock signals including a first divided clock signal, a second divided clock signal, a third divided clock signal, and a fourth divided clock signal. The plurality of divided clock signals have a second phase difference of 90 degrees with respect to each other. The generating of the plurality of divided clock signals includes dividing the first write strobe signal and a second write strobe signal and converting one or more levels of the divided write strobe signals. The duty cycle adjusting circuit is configured to generate a plurality of adjusted clock signals including a first adjusted clock signal, a second adjusted clock signal, a third adjusted clock signal, and a fourth adjusted clock signal. The generating of the plurality of adjusted clock signals includes adjusting a duty cycle of each of the plurality of divided clock signals based on a corresponding control code set of a plurality of control code sets including a first control code set, a second control code set, a third control code set, and a fourth control code set. The read strobe signal generation circuit is configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree. The skew monitoring circuit is configured to generate a first up/down signal by monitoring a first duty cycle of the first read strobe signal and a second duty cycle of the second read strobe signal. The trimming circuit is configured to generate a second up/down signal by monitoring duty cycles of the plurality of read clock signals, and generate the plurality of control code sets based on at least one of an auto calibration code or a fuse calibration code. The auto calibration code is generated based on the first up/down signal. The fuse calibration code is input from an external test device and is stored inside of the trimming circuit based on a wafer level test being performed on the buffer die.

According to an aspect of the present disclosure, a buffer die provided in a wafer includes a write strobe signal generation circuit, a dividing and converting circuit, a duty cycle adjusting circuit, a read strobe signal generation circuit, a skew monitoring circuit, and a trimming circuit. The write strobe signal generation circuit is configured to, based on being enabled in a wafer level test on the buffer die, generate a first write strobe signal and a second write strobe signal having a first phase difference of 180 degrees from the first write strobe signal. The dividing and converting circuit is configured to generate a plurality of divided clock signals including a first divided clock signal, a second divided clock signal, a third divided clock signal, and a fourth divided clock signal. The plurality of divided clock signals have a second phase difference of 90 degrees with respect to each other. The generating of the plurality of divided clock signals includes dividing the first write strobe signal and the second write strobe signal, and converting one or more levels of the divided write strobe signals. The duty cycle adjusting circuit is configured to generate a plurality of adjusted clock signals including a first adjusted clock signal, a second adjusted clock signal, a third adjusted clock signal, and a fourth adjusted clock signal. The generating of the plurality of adjusted clock signals includes adjusting a duty cycle of each of the plurality of divided clock signals based on a corresponding control code set of a plurality of control code sets including a first control code set, a second control code set, a third control code set, and a fourth control code set. The read strobe signal generation circuit is configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree. The skew monitoring circuit is configured to generate a first up/down signal by monitoring a first duty cycle of the first read strobe signal and a second duty cycle of the second read strobe signal. The trimming circuit is configured to generate a second up/down signal by monitoring duty cycles of the plurality of read clock signals, generate the plurality of control code sets based on at least one of an auto calibration code or a fuse calibration code, obtain, from an external test device, the fuse calibration code, cancel an offset of the write strobe signal generation circuit by activating the flipping, and generate the auto calibration code by averaging a first auto calibration code obtained based on the flipping being deactivated and a second auto calibration code obtained based on the flipping being activated. The auto calibration code has been generated based on the first up/down signal. The fuse calibration code has been generated based on the first up/down signal and the second up/down signal.

Accordingly, the write strobe signal generation circuit is formed in each of buffer dies on a wafer in a wafer level, the write strobe signal generation circuit generates the first write strobe signal and the second write strobe signal and a skew between the first read strobe signal and the second read strobe signal is compensated for by monitoring the duty cycle of the first read strobe signal and the second read strobe signal based on the first write strobe signal and the second write strobe signal in a wafer level. Therefore, a defective buffer die may be screened in the wafer level, and because a buffer die passing a wafer level test is packaged into a stacked memory device with core dies passing a wafer level test, yield of the stacked memory device may be increased and a performance of the stacked memory device may be enhanced.

Additional aspects may be set forth in part in the description which follows and, in part, may be apparent from the description, and/or may be learned by practice of the presented embodiments.

BRIEF DESCRIPTION OF DRAWINGS

The above and other aspects, features, and advantages of certain embodiments of the present disclosure may be more apparent from the following description taken in conjunction with the accompanying drawings, in which

FIG. 4 is a block diagram illustrating an example of a write strobe signal (WDQS) generation circuit in the buffer die of FIG. 3, according to example embodiments;

FIG. 5 is a block diagram illustrating an example of the dividing and converting circuit in the buffer die of FIG. 3, according to example embodiments;

FIG. 6B illustrates that the duty cycle adjusting circuit in FIG. 3 adjusts each duty cycle of the first through fourth divided clock signal, according to example embodiments;

FIG. 9 illustrates examples of the first predetermined pattern data and the second predetermined pattern data in the strobe signal generation circuit of FIG. 7, according to example embodiments;

FIG. 13 illustrates examples of the first selected calibration code and the first control code set in the first decoder of FIG. 12, according to example embodiments;

FIG. 15 is a flow chart illustrating fabrication process of a stacked memory device, according to example embodiments;

DETAILED DESCRIPTION

Figure 1:
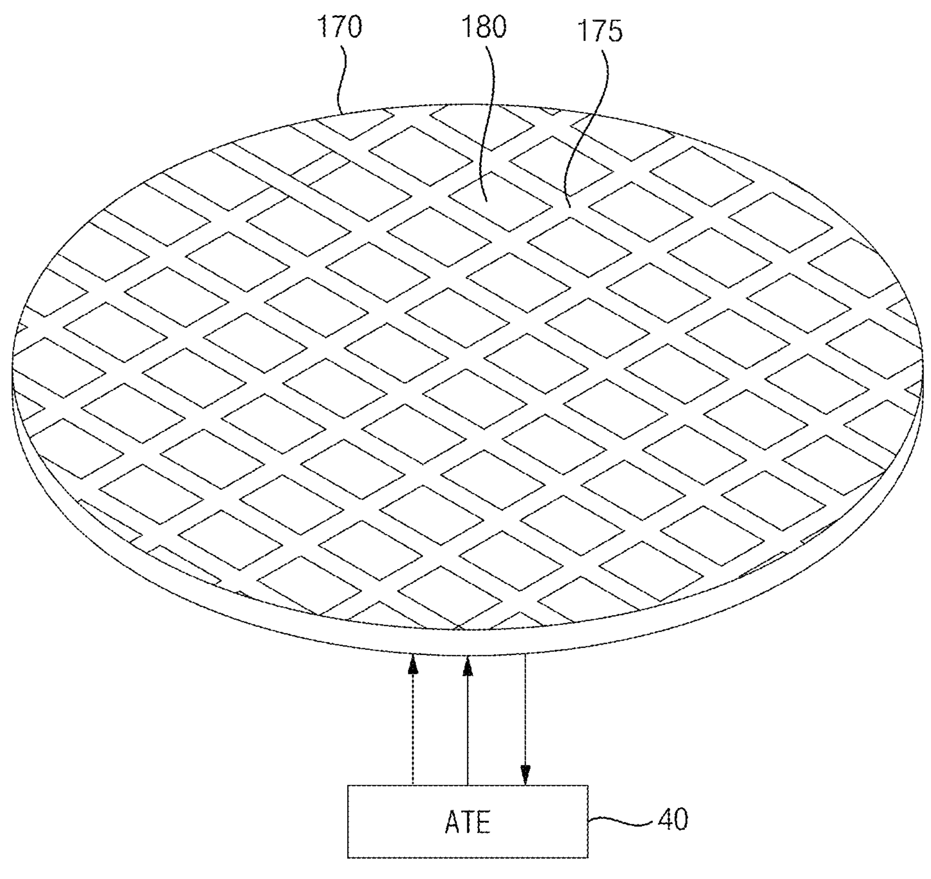
FIG. 1 is a schematic diagram of a wafer on which a plurality of buffer dies are provided, according to example embodiments.

The following description with reference to the accompanying drawings is provided to assist in a comprehensive understanding of embodiments of the present disclosure defined by the claims and their equivalents. Various specific details are included to assist in understanding, but these details are considered to be exemplary only. Therefore, those of ordinary skill in the art may recognize that various changes and modifications of the embodiments described herein may be made without departing from the scope and spirit of the disclosure. In addition, descriptions of well-known functions and structures are omitted for clarity and conciseness.

With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

It is to be understood that when an element or layer is referred to as being "over," "above," "on," "below," "under," "beneath," "connected to" or "coupled to" another element or layer, it may be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

The terms "upper," "middle", "lower", and the like may be replaced with terms, such as "first," "second," third" to be used to describe relative positions of elements. The terms "first," "second," third" may be used to describe various elements but the elements are not limited by the terms and a "first element" may be referred to as a "second element". Alternatively or additionally, the terms "first", "second", "third", and the like may be used to distinguish components from each other and do not limit the present disclosure. For example, the terms "first", "second", "third", and the like may not necessarily involve an order or a numerical meaning of any form.

As used herein, when an element or layer is referred to as "penetrating" another element or layer, the element or layer may penetrate at least a portion of the other element or layer, where the portion may include a fraction of the other element or may include an entire dimension (e.g., length, width, depth) of the other element.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms.

It is to be understood that the specific order or hierarchy of blocks in the processes/flowcharts disclosed are an illustration of exemplary approaches. Based upon design preferences, it is understood that the specific order or hierarchy of blocks in the processes/flowcharts may be rearranged. Further, some blocks may be combined or omitted. The accompanying claims present elements of the various blocks in a sample order, and are not meant to be limited to the specific order or hierarchy presented.

The embodiments herein may be described and illustrated in terms of blocks, as shown in the drawings, which carry out a described function or functions. These blocks, which may be referred to herein as units or modules or the like, or by names such as device, logic, circuit, controller, counter, comparator, generator, converter, or the like, may be physically implemented by analog and/or digital circuits including one or more of a logic gate, an integrated circuit, a microprocessor, a microcontroller, a memory circuit, a passive electronic component, an active electronic component, an optical component, and the like.

In the present disclosure, the articles “a” and “an” are intended to include one or more items, and may be used interchangeably with “one or more.” Where only one item is intended, the term “one” or similar language is used. For example, the term “a processor” may refer to either a single processor or multiple processors. When a processor is described as carrying out an operation and the processor is referred to perform an additional operation, the multiple operations may be executed by either a single processor or any one or a combination of multiple processors.

Hereinafter, various embodiments of the present disclosure are described with reference to the accompanying drawings.

Figure 2:
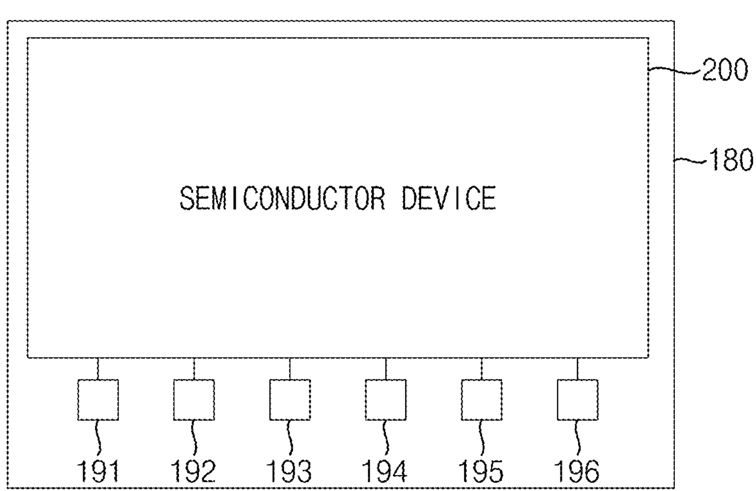
FIG. 2 is an enlarged diagram of a die in FIG. 1, according to example embodiments.

FIG. 1 is a schematic diagram of a wafer on which a plurality of buffer dies are provided (e.g., formed) according to example embodiments. FIG. 2 is an enlarged diagram of a die in FIG. 1, according to example embodiments.

Referring to FIGS. 1 and 2, a plurality of dies 180 may be formed on a wafer 170 through a fabrication (FAB) process. The plurality of dies 180 may be singulated along a scribe line 175. The plurality of dies 180 may be fabricated into individual unit chips or packages through an assembly process.

Between the FAB process and the assembly process, a wafer level test process and/or an electric die sorting (EDS) process may be performed. The electrical characteristics of a semiconductor device 200 formed in each of the plurality of dies 180 may be tested during the wafer level test process and/or the EDS process. The wafer level testing process may be and/or may include a process in which test operation signals may be applied to a die of the plurality of dies 180 formed on the wafer 170 and test result signals output by the die 180 in response to the test operation signals may be analyzed to determine whether the die 180 has a defect.

An automatic test equipment (ATE) 40 may provide the test operation signals, transfer the test operation signals to the die 180 via a probe card, and may determine whether the die 180 is defective by receiving the test result signals in response to the test operation signals from the die 180 via the probe card.

Each die of the plurality of dies 180 may include a plurality of test pads (e.g., a first test pad 191, a second test pad 192, a third test pad 193, a fourth test pad 194, a fifth test pad 195, and a sixth test pad 196) thereon, which may support the wafer level test. When the probe card physically and/or electrically contacts the plurality of test pads 191 to 196, the die 180 may perform the test mode in response to the test operation signals.

As shown in FIG. 2, the die 180 may include the plurality of test pads 191 to 196 and the semiconductor device 200. In an embodiment, the semiconductor device 200 may be provided as a buffer die.

In an embodiment, the first test pad 191 may receive a test enable signal and the second to sixth test pads 192 to 196 may receive test operation signals that may be applied to the semiconductor device 200. The test operation signals may include, but not be limited to, a test clock signal, a test command signal, a test pattern signal, or the like for controlling operations of the semiconductor device 200. The die 180 may be connected to the ATE 40 having a probe through the plurality of test pads 191 to 196 for performing the wafer level test.

Hereinafter, the semiconductor device 200 may be referred to as a buffer die.

When the buffer die 200 passes a wafer level test and after the buffer die 200 is packaged into a stacked memory device with a plurality of core dies, the buffer die 200 may compensate for skews based on control code sets obtained in the wafer level test on the buffer die 200.

Figure 3:
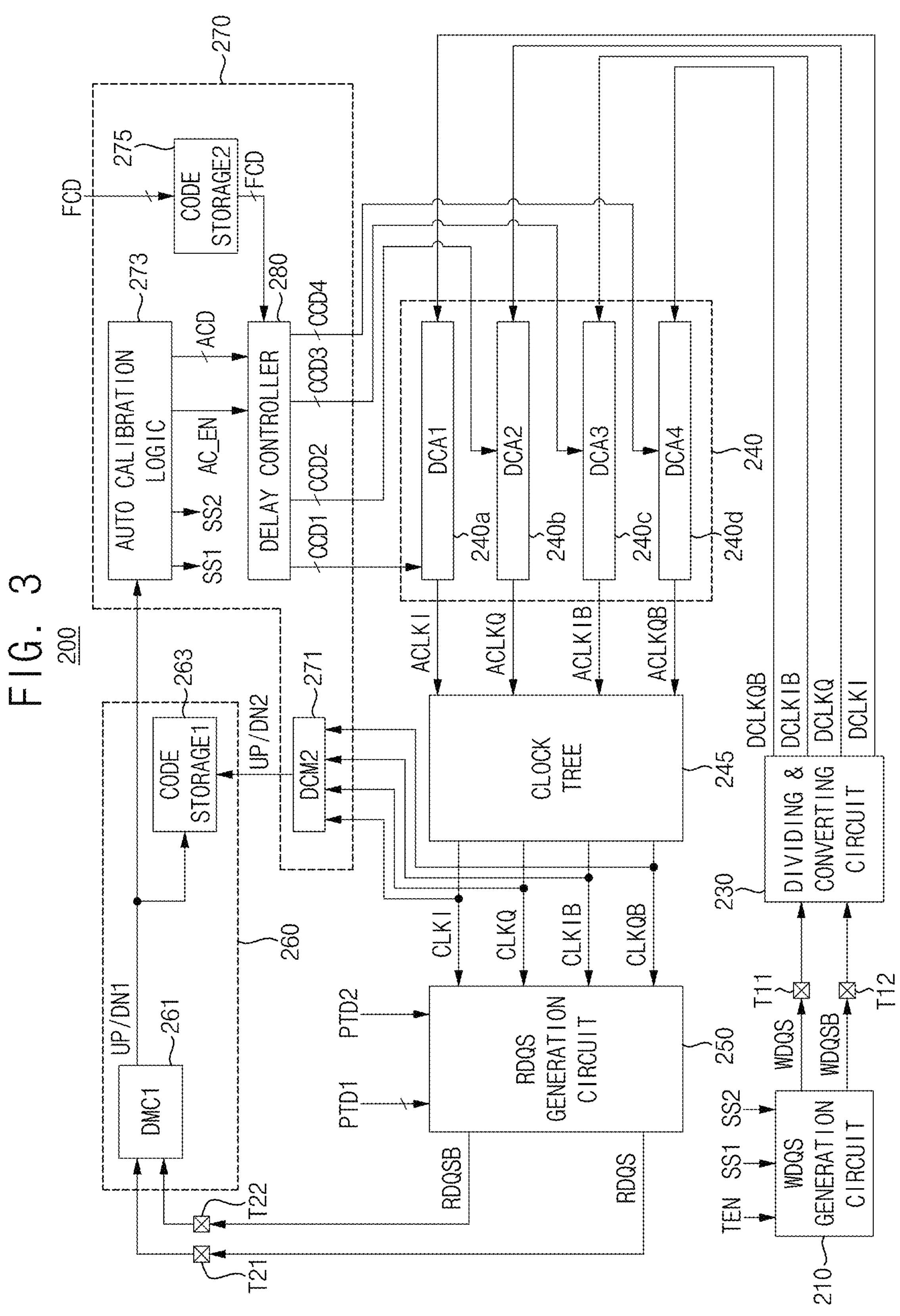
FIG. 3 is a block diagram illustrating an example of the buffer die in FIG. 2, according to example embodiments.

FIG. 3 is a block diagram illustrating an example of the buffer die in FIG. 2, according to example embodiments.

Referring to FIG. 3, the buffer die 200 may include a write strobe signal (WDQS) generation circuit 210, a dividing and converting circuit 230, a duty cycle adjusting circuit 240, a clock tree 245, a read strobe signal (RDQS) generation circuit 250, a skew monitoring circuit 260, and a trimming circuit 270.

The WDQS generation circuit 210 may be enabled in a wafer level test on the buffer die 200 and may generate a first write strobe signal WDQS and a second write strobe signal WDQSB having a phase difference of 180 degrees from the first write strobe signal WDQS.

The dividing and converting circuit 230 may receive the first write strobe signal WDQS and the second write strobe signal WDQSB through a first terminal T11 and a second terminal T12 and may generate a plurality of divided clock signals (e.g., a first divided clock signal DCLKI, a second divided clock signal DCLKQ, a third divided clock signal DCLKIB, and a fourth divided clock signal DCLKQB) having a phase difference of 90 degrees with respect to each other by dividing the first write strobe signal WDQS and the second write strobe signal WDQSB, respectively, and by converting levels of the divided signals. After the buffer die 200 is packaged into a stacked memory device, the WDQS generation circuit 210 may be disabled and the dividing and converting circuit 230 may receive the first write strobe signal WDQS and the second write strobe signal WDQSB from an external host device through the first terminal T11 and the second terminal T12.

The duty cycle adjusting circuit 240 may generate a plurality of adjusted clock signals (e.g., a first adjusted clock signal ACKKI, a second adjusted clock signal ACLKQ, a third adjusted clock signal ACLKIB, and a fourth adjusted clock signal ACLKQB) by adjusting a duty cycle of each of the plurality of divided clock signals DCLKI to DCLKQB based on corresponding control codes from among a plurality of control code sets (e.g., a first control code set CCD1, a second control code set CCD2, a third control code set CCD3, and a fourth control code set CCD4).

A plurality of read clock signals (e.g., a first read clock signal CLKI, a second read clock signal CLKQ, a third read clock signal CLKIB, and a fourth read clock signal CLKQB) may be obtained by passing the plurality of adjusted clock signals ACKKI to ACLKQB through the clock tree 245. The plurality of read clock signals CLKI to CLKQB may be provided to the RDQS generation circuit 250.

The RDQS generation circuit 250 may generate a first read strobe signal RDQS and a second read strobe signal RDQSB having a phase difference of 180 degrees from the first read strobe signal RDQS, based on a first predetermined pattern data PTD1, a second predetermined pattern data PTD2, and the plurality of read clock signals CLKI to CLKQB. In an embodiment, the RDQS generation circuit 250 may provide the first read strobe signal RDQS and the second read strobe signal RDQSB to the skew monitoring circuit 260.

The skew monitoring circuit 260 may receive the first read strobe signal RDQS and the second read strobe signal RDQSB through a third terminal T21 and a fourth terminal T22, may generate a first up/down signal UP/DN1 by monitoring a duty cycle of the first read strobe signal RDQS and the second read strobe signal RDQSB, may store the first read strobe signal RDQS and the second read strobe signal RDQSB therein, and may provide the first read strobe signal RDQS and the second read strobe signal RDQSB to the trimming circuit 270.

The trimming circuit 270 may generate a second up/down signal UP/DN2 by monitoring duty cycles of the plurality of read clock signals CLKI to CLKQB, may provide the second up/down signal UP/DN2 to the skew monitoring circuit 260, may generate the plurality of control code sets CCD1 to CCD4 based on at least one of an auto calibration code ACD or a fuse calibration code TCD, and may provide the plurality of control code sets CCD1 to CCD4 to the duty cycle adjusting circuit 240. The auto calibration code ACD may be generated based on the first up/down signal UP/DN1.

The fuse calibration code FCD may be input from an external test device (e.g., the ATE 40 in FIG. 1) based on the first up/down signal UP/DN1 and the second up/down signal UP/DN2.

The duty cycle adjusting circuit 240 may include a first duty cycle adjuster DCA1 240*a*, a second duty cycle adjuster DCA2 240*b*, a third duty cycle adjuster DCA3 240*c*, and a fourth duty cycle adjuster DCA4 240*d*.

The first duty cycle adjuster 240*a* may generate the first adjusted clock signal ACLKI by adjusting a delay amount of at least one of a rising edge or a falling edge of the first divided clock signal DCLKI based on the first control code set CCD1. The second duty cycle adjuster 240*b* may generate the second adjusted clock signal ACLKB by adjusting a delay amount of at least one of a rising edge or a falling edge of the second divided clock signal DCLKQ based on the second control code set CCD2. The third duty cycle adjuster 240*c* may generate the third adjusted clock signal ACLKIB by adjusting a delay amount of at least one of a rising edge or a falling edge of the third divided clock signal DCLKIB based on the third control code set CCD3. The fourth duty cycle adjuster 240*d* may generate the fourth adjusted clock signal ACLKQB by adjusting a delay amount of at least one of a rising edge or a falling edge of the fourth divided clock signal DCLKQB based on the fourth control code set CCD4.

The skew monitoring circuit 260 may include a first duty cycle monitor DCM1 261 and a first code storage 263.

The first duty cycle monitor 261 may generate the first up/down signal UP/DN1 by monitoring the duty cycle of the first read strobe signal RDQS and the second read strobe signal RDQSB, and may store the first up/down signal UP/DN1 in the first code storage 263.

The trimming circuit 270 may include a second duty cycle monitor DCM2 271, an auto calibration logic 273, a second code storage 275, and a delay controller 280.

The second duty cycle monitor 271 may generate the second up/down signal UP/DN2 by monitoring each duty cycle of the plurality of read clock signals CLKI to CLKQB, and may store the second up/down signal UP/DN2 in the first code storage 263.

The first code storage 263 may store the first up/down signal UP/DN1 and the second up/down signal UP/DN2 by accumulating the first up/down signal UP/DN1 and the second up/down signal UP/DN2, respectively. The external test device (e.g., the ATE 40 in FIG. 1) may read the first up/down signal UP/DN1 and the second up/down signal UP/DN2 from the first code storage 263 and may store the fuse calibration code FCD in the second code storage 275 based on the first up/down signal UP/DN1 and the second up/down signal UP/DN2.

The auto calibration logic 273 may generate the auto calibration code ACD based on the first up/down signal UP/DN1, may generate a first selection signal SS1 and a second selection signal SS2, may generate an auto calibration enable signal AC_EN, may provide the first selection signal SS1 and the second selection signal SS2 to the WDQS generation circuit 210, and may provide the auto calibration enable signal AC_EN to the delay controller 280.

The first selection signal SS1 may be associated with a frequency of each of the first write strobe signal WDQS and the second write strobe signal WDQSB and the second selection signal SS2 may be associated with a phase of each of the first write strobe signal WDQS and the second write strobe signal WDQSB. When the second selection signal SS2 indicates that a flipping is activated, the phase of each of the first write strobe signal WDQS and the second write strobe signal WDQSB may be inverted.

The delay controller 280 may select at least one of the auto calibration code ACD or the fuse calibration code FCD in response to the auto calibration enable signal AC_EN, may generate the plurality of control code sets CCD1 to CCD4 based on the selected calibration code, and may provide the plurality of control code sets CCD1 to CCD4 to the duty cycle adjusting circuit 240.

When the auto calibration enable signal AC_EN is activated, the delay controller 280 may select the auto calibration code ACD and may generate the plurality of control code sets CCD1 to CCD4 based on the auto calibration code ACD. When the auto calibration enable signal AC_EN is deactivated, the delay controller 280 may select the fuse calibration code FCD and may generate the plurality of control code sets CCD1 to CCD4 based on the fuse calibration code FCD.

Conventionally, after the buffer die is packaged into a stacked memory device with core dies, duty cycle of the data strobe signals may be monitored in a package level and skew of the data strobe signals may be compensated for based on a result of the monitoring. In such a manner, a buffer die having a defect may be screened before packaging.

However, according to example embodiments, the WDQS generation circuit 210 may be formed in each of buffer dies on a wafer in a wafer level, the WDQS generation circuit 210 may generate the first write strobe signal WDQS and the second write strobe signal WDQSB and a skew between the first read strobe signal RDQS and the second read strobe signal RDQSB may be compensated for by monitoring the duty cycle of the first read strobe signal RDQS and the second read strobe signal RDQSB based on the first write strobe signal WDQS and the second write strobe signal WDQSB in a wafer level. That is, the buffer die 200 may monitor duty cycle of the data strobe signals, may compensate for skew of the data strobe signals based on a result of the monitoring, and may screen a defective buffer die in the wafer level. In addition, because a buffer die passing a wafer level test is packaged into a stacked memory device with core dies passing a wafer level test, yield of the stacked memory device may be increased and a performance of the stacked memory device may be enhanced.

FIG. 4 is a block diagram illustrating an example of the WDQS generation circuit in the buffer die of FIG. 3, according to example embodiments.

Referring to FIG. 4, the WDQS generation circuit 210 may include a source clock generator 211, a phase splitter 216, a first driver 217, a second driver 218, a selective flip circuit 220, and an amplifier 225.

The source clock generator 211 may output at least one of a first source clock signal SCLK1 or a second source clock signal SCLK2 as a source clock SCLK signal in response to the first selection signal SS1. The first source clock signal SCLK1 may have a first frequency and the second source clock signal SCLK2 may have a second frequency smaller than the first frequency.

The source clock generator 211 may include an oscillator OSC 212, a phase-locked loop (PLL) circuit 213 and a multiplexer MUX 214. The oscillator 212 may generate the first source clock signal SCLK1 toggling at the first frequency. The PLL circuit 213 may generate the second source clock signal SCLK2 toggling at the second frequency. The multiplexer 214 may output at least one of the first source clock signal SCLK1 or the second source clock signal SCLK2 as the source clock signal SCLK in response to the first selection signal SS1.

The phase splitter 216 may receive the source clock signal SCLK and may generate a first split clock signal PCLKI and a second split clock signal PCLKIB by splitting a phase of the source clock signal SCLK.

The first driver 217 may drive the first split clock signal PCLKI and provide the first split clock signal PCLKI to the selective flip circuit 220 and the second driver 218 may drive the second split clock signal PCLKIB and provide the second split clock signal PCLKIB to the selective flip circuit 220.

The selective flip circuit 220 may output at least one of the first split clock signal PCLKI or the second split clock signal PCLKIB as a first selected strobe signal SDQS1 and may output the other one of the first split clock signal PCLKI or the second split clock signal PCLKIB as a second selected strobe signal SDQS2, in response to the second selection signal SS2 indicating whether the flipping is activated.

The selective flip circuit 220 may include a first multiplexer 221 and a second multiplexer 223.

The first multiplexer 221 may receive the first split clock signal PCLKI and the second split clock signal PCLKIB, may provide the first split clock signal PCLKI as the first selected strobe signal SDQS1 in response to the second selection signal SS2 indicating that the flipping is deactivated, and may provide the second split clock signal PCLKIB as the second selected strobe signal SDQS2 in response to the second selection signal SS2 indicating that the flipping is activated.

The second multiplexer 223 may receive the first split clock signal PCLKI and the second split clock signal PCLKIB, may provide the second split clock signal PCLKIB as the first selected strobe signal SDQS1 in response to the second selection signal SS2 indicating that the flipping is deactivated, and may provide the first split clock signal PCLKI as the second selected strobe signal SDQS2 in response to the second selection signal SS2 indicating that the flipping is activated.

That is, the selective flip circuit 220 may output the first split clock signal PCLKI and the second split clock signal PCLKIB as the first selected strobe signal SDQS1 and the second selected strobe signal SDQS2, respectively, in response to the second selection signal SS2 indicating that the flipping is deactivated, and may output the second split clock signal PCLKIB and the first split clock signal PCLKI as the first selected strobe signal SDQS1 and the second selected strobe signal SDQS2, respectively, in response to the second selection signal SS2 indicating that the flipping is activated.

The amplifier 225 may output the first write strobe signal WDQS and the second write strobe signal WDQSB by amplifying the first selected strobe signal SDQS1 and the second selected strobe signal SDQS2.

The auto calibration logic 273 in the trimming circuit 270 may cancel an offset of the WDQS generation circuit 210 by activating the flipping using the second selection signal SS2 and may generate the auto calibration code ACD by averaging a first auto calibration code obtained when the flipping is deactivated and a second auto calibration code obtained when the flipping is activated.

FIG. 5 is a block diagram illustrating an example of the dividing and converting circuit in the buffer die of FIG. 3, according to example embodiments.

Referring to FIG. 5, the dividing and converting circuit 230 may include a clock division circuit 231, a current mode logic (CML) driver 235, and a CML to complementary metal-oxide semiconductor (CMOS) level (C2C) converter 237.

The clock division circuit 231 may generate a first divided strobe signal dDQSI and a third divided strobe signal dDQSIB having a phase difference of 180 degrees by dividing a frequency of the first write strobe signal WDQS, and may generate a second divided strobe signal dDQSQ and a fourth divided strobe signal dDQSQB having a phase difference of 180 degrees by dividing a frequency of the second write strobe signal WDQSB.

The clock division circuit 231 may include a first clock divider 232 and a second clock divider 234. The first clock divider 232 may generate the first divided strobe signal dDQSI and the third divided strobe signal dDQSIB by dividing the frequency of the first write strobe signal WDQS by two (2). The second clock divider 234 may generate the second divided strobe signal dDQSQ and the fourth divided strobe signal dDQSQB by dividing the frequency of the second write strobe signal WDQSB by two (2).

The CML driver 235 may generate a plurality of intermediate clock signals (e.g., a first intermediate clock signal ICLKI, a second intermediate clock signal ICLKQ, a third intermediate clock signal ICLKIB, and a fourth intermediate clock signal ICLKQB) by driving the plurality of divided strobe signals (e.g., the first divided strobe signal dDQSI, the second divided strobe signal dDQSQ, the third divided strobe signal dDQSIB, and the fourth divided strobe signal dDQSQB) having a CML level, respectively.

The C2C converter 237 may generate the plurality of divided clock signals DCLKI to DCLKQB having a CMOS level based on the plurality of intermediate clock signals ICLKI to ICLKQB, respectively. That is, the C2C converter 237 may generate the plurality of divided clock signals DCLKI to DCLKQB having the CMOS level by converting each level of the plurality of intermediate clock signals ICLKI to ICLKQB.

Figure 6A:
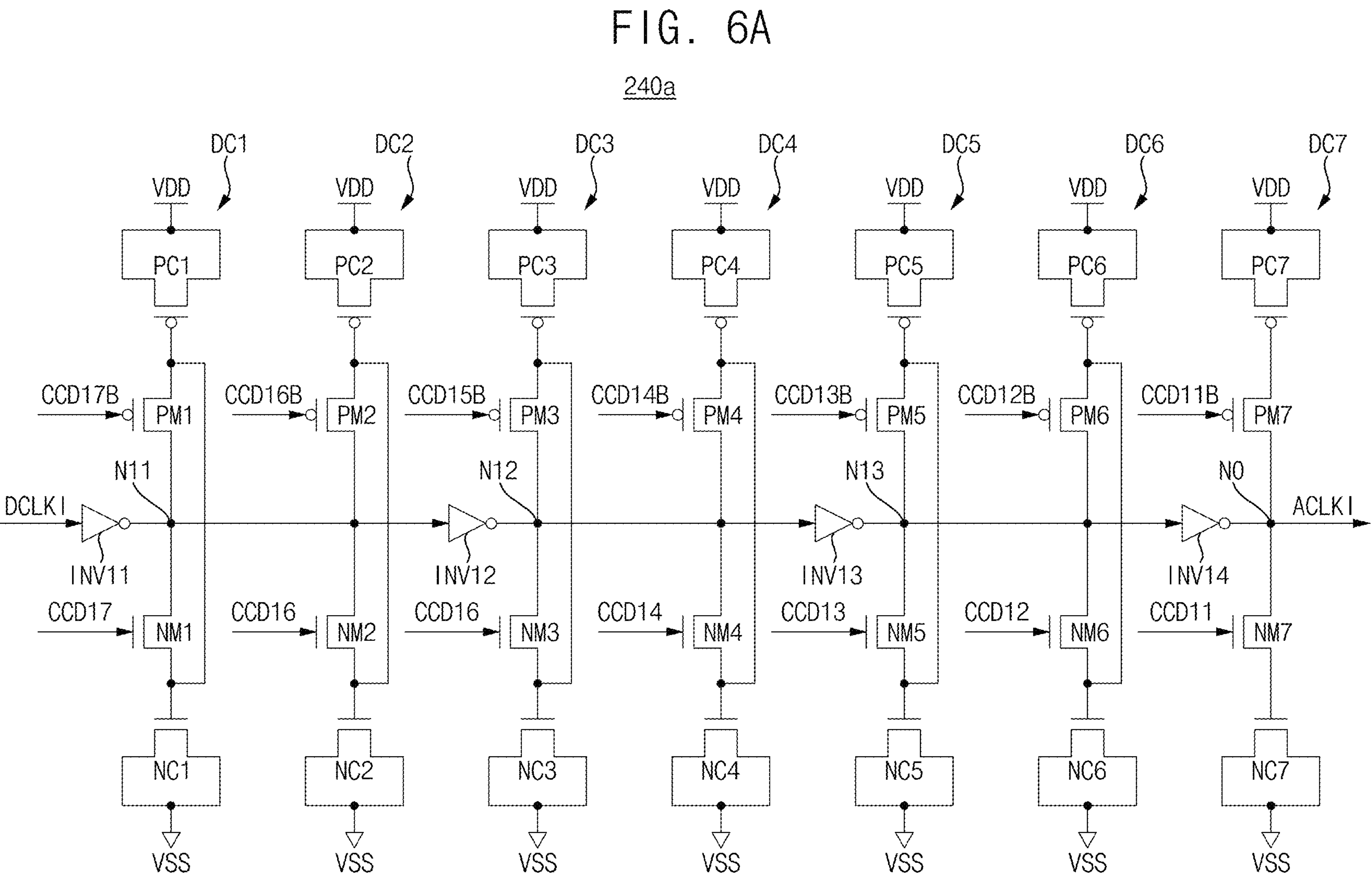
FIG. 6A is a circuit diagram illustrating an example of the first duty cycle adjuster in the duty cycle adjusting circuit in the buffer die of FIG. 3, according to example embodiments.

FIG. 6A is a circuit diagram illustrating an example of the first duty cycle adjuster in the duty cycle adjusting circuit in the buffer die of FIG. 3, according to example embodiments.

Referring to FIG. 6A, the first duty cycle adjuster 240*a* may include a plurality of inverters (e.g., a first inverter INV11, a second inverter INV12, a third inverter INV13, and a fourth inverter INV14) and a plurality of delay cells (e.g., a first delay cell DC1, a second delay cell DC2, a third delay cell DC3, a fourth delay cell DC4, a fifth delay cell DC5, a sixth delay cell DC6, and a seventh delay cell DC7).

The plurality of inverters INV11 to INV14 may be connected in series.

The first delay cell DC1 and the second delay cell DC2 may be coupled between two adjacent inverters (e.g., the first inverter INV11 and the second inverter INV12), the third delay cell DC3 and the fourth delay cell DC4 may be coupled between two adjacent inverters (e.g., the second inverter INV12 and the third inverter INV13), the fifth delay cell DC5 and sixth delay cell DC6 may be coupled between two adjacent inverters (e.g., the third inverter INV13 and the fourth inverter INV14), and the seventh delay cell DC7 may be coupled to an output of a last inverter (e.g., the fourth inverter INV14). In an embodiment, the first delay cell DC1, the second delay cell DC2, the third delay cell DC3, the fourth delay cell DC4, the fifth delay cell DC5, and the sixth delay cell DC6 may be referred to as a plurality of first delay cells and the seventh delay cell DC7 may be referred to as a second delay cell.

The first delay cell DC1 may include a first p-channel metal-oxide semiconductor (PMOS) capacitor (e.g., a first MOS capacitor) PC1 coupled to a power supply voltage VDD, a first n-channel metal-oxide semiconductor (NMOS) capacitor (e.g., a second MOS capacitor) NC1 coupled to a ground voltage VSS, a first PMOS transistor PM1 coupled to a gate of the first PMOS capacitor PC1, and a first NMOS transistor NM1 coupled to a gate of the first NMOS capacitor NC1.

The first PMOS transistor PM1 may have a source coupled to the gate of the first PMOS capacitor PC1, a gate receiving a seventh inverted version CCD17B of a corresponding seventh bit CCD17 of the first control code set CCD1, and a drain coupled to a first node N11. The first node N11 may be commonly coupled to the drain of the first PMOS transistor PM1, an output of the first inverter INV11, and an input of the second inverter INV12. The first NMOS transistor NM1 may have a source coupled to the gate of the first NMOS capacitor NC1, a gate receiving the corresponding seventh bit CCD17 of the first control code set CCD1, and a drain coupled to the first node N11. Sources of the first PMOS transistor PM1 and the first NMOS transistor NM1 may be coupled to each other.

The second delay cell DC2 may include a second PMOS capacitor PC2 coupled to the power supply voltage VDD, a second NMOS capacitor NC2 coupled to the ground voltage VSS, a second PMOS transistor PM2 coupled to a gate of the second PMOS capacitor PC2, and a second NMOS transistor NM2 coupled to a gate of the second NMOS capacitor NC2.

The second PMOS transistor PM2 may have a source coupled to the gate of the second PMOS capacitor PC2, a gate receiving a sixth inverted version CCD16B of a corresponding sixth bit CCD16 of the first control code set CCD1, and a drain coupled to the first node N11. The second NMOS transistor NM2 may have a source coupled to the gate of the second NMOS capacitor NC2, a gate receiving the corresponding sixth bit CCD16 of the first control code set CCD1, and a drain coupled to the first node N11. Sources of the second PMOS transistor PM2 and the second NMOS transistor NM2 may be coupled to each other.

The third delay cell DC3 may include a third PMOS capacitor PC3 coupled to the power supply voltage VDD, a third NMOS capacitor NC3 coupled to the ground voltage VSS, a third PMOS transistor PM3 coupled to a gate of the third PMOS capacitor PC3, and a third NMOS transistor NM3 coupled to a gate of the third NMOS capacitor NC3.

The third PMOS transistor PM3 may have a source coupled to the gate of the third PMOS capacitor PC3, a gate receiving a fifth inverted version CCD15B of a corresponding fifth bit CCD15 of the first control code set CCD1, and a drain coupled to a second node N12. The second node N12 may be commonly coupled to the drain of the third PMOS transistor PM3, an output of the second inverter INV12, and an input of the third inverter INV13. The third NMOS transistor NM3 may have a source coupled to the gate of the third NMOS capacitor NC3, a gate receiving the corresponding fifth bit CCD15 of the first control code set CCD1, and a drain coupled to the second node N12. Sources of the third PMOS transistor PM3 and the third NMOS transistor NM3 may be coupled to each other.

The fourth delay cell DC4 may include a fourth PMOS capacitor PC4 coupled to the power supply voltage VDD, a fourth NMOS capacitor NC4 coupled to the ground voltage VSS, a fourth PMOS transistor PM4 coupled to a gate of the fourth PMOS capacitor PC4, and a fourth NMOS transistor NM4 coupled to a gate of the fourth NMOS capacitor NC4.

The fourth PMOS transistor PM4 may have a source coupled to the gate of the fourth PMOS capacitor PC4, a gate receiving a fourth inverted version CCD14B of a corresponding fourth bit CCD14 of the first control code set CCD1, and a drain coupled to the second node N12. The fourth NMOS transistor NM4 may have a source coupled to the gate of the fourth NMOS capacitor NC4, a gate receiving the corresponding fourth bit CCD14 of the first control code set CCD1, and a drain coupled to the second node N12. Sources of the fourth PMOS transistor PM4 and the fourth NMOS transistor NM4 may be coupled to each other.

The fifth delay cell DC5 may include a fifth PMOS capacitor PC5 coupled to the power supply voltage VDD, a fifth NMOS capacitor NC5 coupled to the ground voltage VSS, a fifth PMOS transistor PM5 coupled to a gate of the fifth PMOS capacitor PC5, and a fifth NMOS transistor NM5 coupled to a gate of the fifth NMOS capacitor NC5.

The fifth PMOS transistor PM5 may have a source coupled to the gate of the fifth PMOS capacitor PC5, a gate receiving a third inverted version CCD13B of a corresponding third bit CCD13 of the first control code set CCD1, and a drain coupled to a third node N13. The third node N13 may be commonly coupled to the drain of the fifth PMOS transistor PM5, an output of the third inverter INV13, and an input of the fourth inverter INV14. The fifth NMOS transistor NM5 may have a source coupled to the gate of the fifth NMOS capacitor NC5, a gate receiving the corresponding third bit CCD13 of the first control code set CCD1, and a drain coupled to the third node N13. Sources of the fifth PMOS transistor PM5 and the fifth NMOS transistor NM5 may be coupled to each other.

The sixth delay cell DC6 may include a sixth PMOS capacitor PC6 coupled to the power supply voltage VDD, a sixth NMOS capacitor NC6 coupled to the ground voltage VSS, a sixth PMOS transistor PM6 coupled to a gate of the sixth PMOS capacitor PC6, and a sixth NMOS transistor NM6 coupled to a gate of the sixth NMOS capacitor NC6.

The sixth PMOS transistor PM6 may have a source coupled to the gate of the sixth PMOS capacitor PC6, a gate receiving a second inverted version CCD12B of a corresponding second bit CCD12 of the first control code set CCD1, and a drain coupled to the third node N13. The sixth NMOS transistor NM6 may have a source coupled to the gate of the sixth NMOS capacitor NC6, a gate receiving the corresponding second bit CCD12 of the first control code set CCD1, and a drain coupled to the third node N13. Sources of the sixth PMOS transistor PM7 and the sixth NMOS transistor NM6 may be coupled to each other.

The seventh delay cell DC7 may include a seventh PMOS capacitor PC7 coupled to the power supply voltage VDD, a seventh NMOS capacitor NC7 coupled to the ground voltage VSS, a seventh PMOS transistor PM7 coupled to a gate of the seventh PMOS capacitor PC7, and a seventh NMOS transistor NM7 coupled to a gate of the seventh NMOS capacitor NC6.

The seventh PMOS transistor PM7 may have a source coupled to the gate of the seventh PMOS capacitor PC7, a gate receiving a first inverted version CCD11B of a corresponding first bit CCD11 of the first control code set CCD1, and a drain coupled to an output node NO coupled to the output of the third inverter N13. The seventh NMOS transistor NM7 may have a source coupled to the gate of the seventh NMOS capacitor NC7, a gate receiving the corresponding first bit CCD11 of the first control code set CCD1, and a drain coupled to the output node NO. Sources of the seventh PMOS transistor PM7 and the seventh NMOS transistor NM7 may be coupled to each other.

The first duty cycle adjuster 240*a* may generate the first adjusted clock signal ACLKI by adjusting a delay amount of at least one of a rising edge or a falling edge of the first divided clock signal DCLKI based on the first to seventh bits CCD11 to CCD17 and the first to seventh inverted versions CCD11B to CCD17B of the first control code set CCD1.

Although an example of a configuration of the first duty cycle adjuster 240*a* in the duty cycle adjusting circuit 240 is illustrated in FIG. 6A, each configuration of the second duty cycle adjuster 240*b*, the third duty cycle adjuster 240*c*, and the fourth duty cycle adjuster 240*d* may be substantially similar and/or the same as the configuration of the first duty cycle adjuster 240*a*.

That is, the second duty cycle adjuster 240*b* may generate the second adjusted clock signal ACLKQ by adjusting a delay amount of at least one of a rising edge or a falling edge of the second divided clock signal DCLKQ based on bits and inverted versions of the second control code set CCD2. The third duty cycle adjuster 240*c* may generate the third adjusted clock signal ACLKIB by adjusting a delay amount of at least one of a rising edge or a falling edge of the third divided clock signal DCLKIB based on bits and inverted versions of the third control code set CCD3. The fourth duty cycle adjuster 240*d* may generate the fourth adjusted clock signal ACLKQB by adjusting a delay amount of at least one of a rising edge or a falling edge of the fourth divided clock signal DCLKQB based on bits and inverted versions of the fourth control code set CCD4.

Figure 6B:
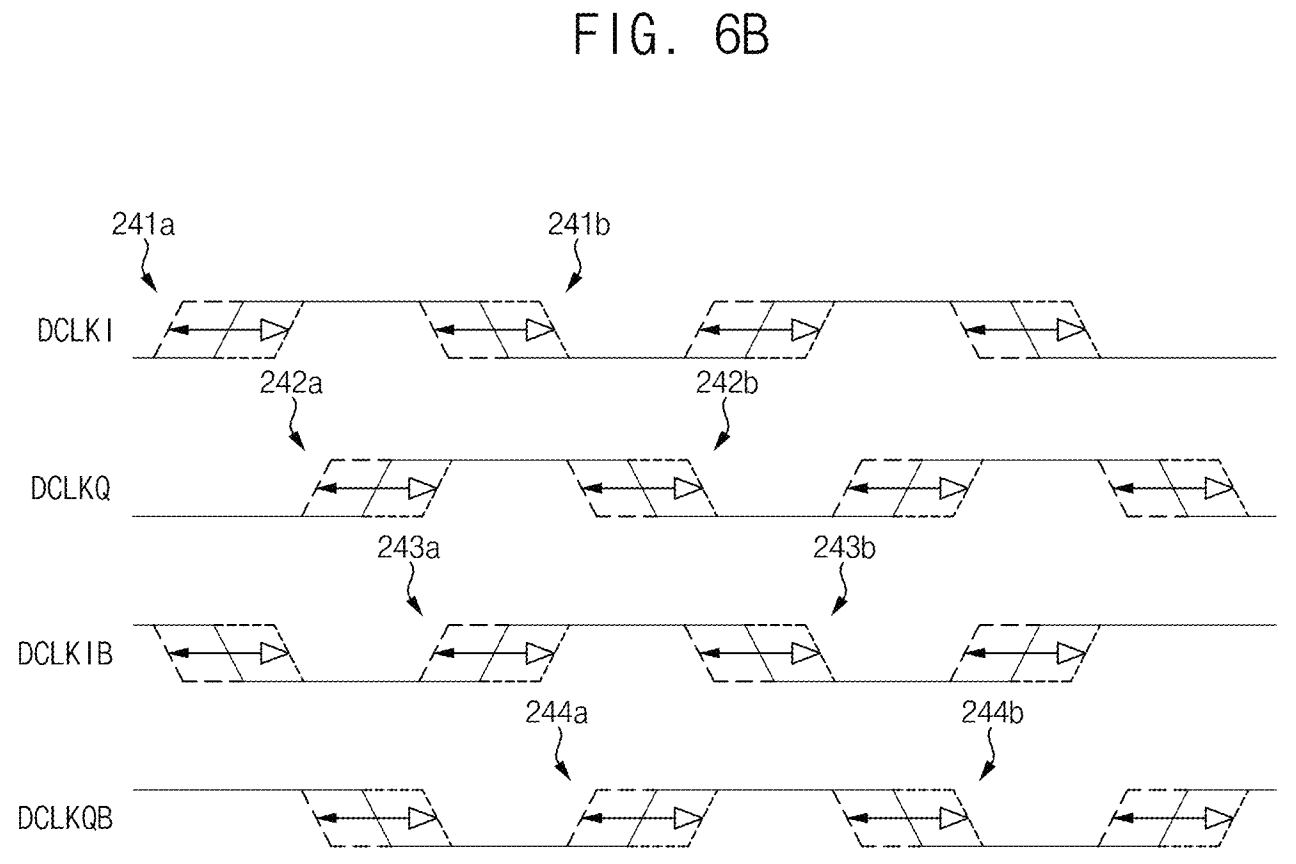

FIG. 6B illustrates that the duty cycle adjusting circuit in FIG. 3 adjusts each duty cycle of the plurality of divided clock signals DCLKI to DCLKQB.

Referring to FIGS. 3 and 6B, the first duty cycle adjuster 240*a* may generate the first adjusted clock signal ACLKI by adjusting a delay amount of a rising edge of the first divided clock signal DCLKI (operation 241*a*) and/or by adjusting a delay amount of a falling edge of the first divided clock signal DCLKI (operation 241*b*), based on the first control code set CCD1. The second duty cycle adjuster 240*b* may generate the second adjusted clock signal ACLKQ by adjusting a delay amount of a rising edge of the second divided clock signal DCLKQ (operation 242*a*) and/or by adjusting a delay amount of a falling edge of the second divided clock signal DCLKQ (operation 242*b*), based on the second control code set CCD2. The third duty cycle adjuster 240*c* may generate the third adjusted clock signal ACLKIB by adjusting a delay amount of a rising edge of the third divided clock signal DCLKIB (operation 243*a*) and/or by adjusting a delay amount of a falling edge of the third divided clock signal DCLKIB (operation 243*b*), based on the third control code set CCD3. The fourth duty cycle adjuster 240*d* may generate the fourth adjusted clock signal ACLKQB by adjusting a delay amount of a rising edge of the fourth divided clock signal DCLKQB (operation 244*a*) and/or by adjusting a delay amount of a falling edge of the fourth divided clock signal DCLKQB (operation 244*b*), based on the fourth control code set CCD4.

Figure 7:
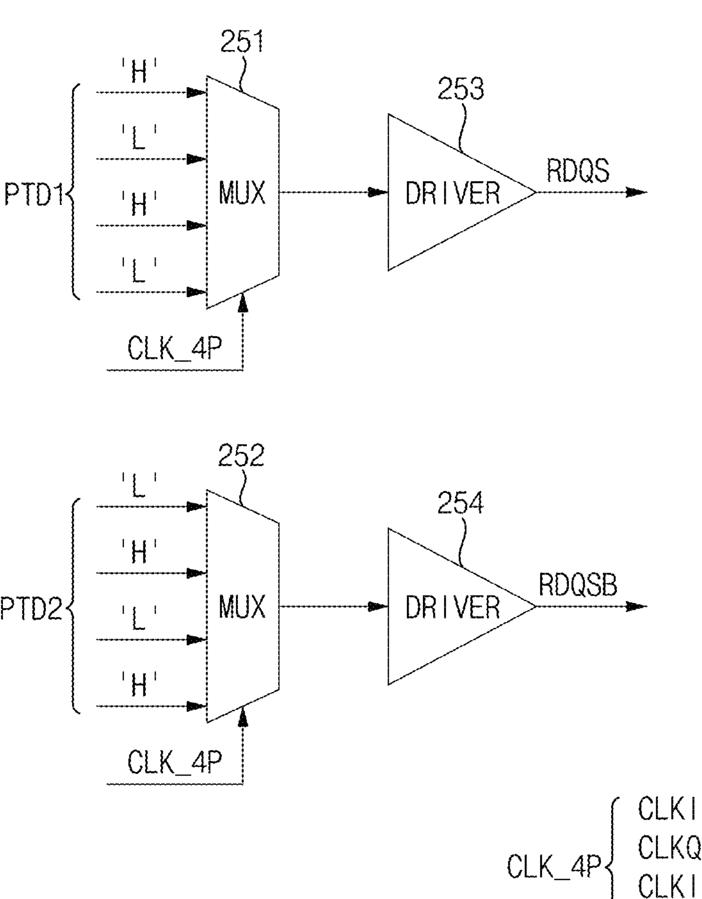
FIG. 7 is a block diagram illustrating an example of the read strobe signal (RDQS) generation circuit in the buffer die of FIG. 3, according to example embodiments.

FIG. 7 is a block diagram illustrating an example of the RDQS generation circuit in the buffer die of FIG. 3, according to example embodiments.

Referring to FIG. 7, the RDQS generation circuit 250 may include a first multiplexer 251, a second multiplexer 252, a first driver 253, and a second driver 254.

The first multiplexer 251 may sequentially select bits of the first predetermined pattern data PTD1 based on a four-phase clock signal CLK_4P including the plurality of read clock signals CLKI, to CLKQB and the first driver 253 may output the first read strobe signal RDQS by driving an output of the first multiplexer 251. The first multiplexer 251 may sequentially select bits of the first predetermined pattern data PTD1 at respective rising edges of the plurality of read clock signals CLKI, to CLKQB.

The second multiplexer 252 may sequentially select bits of the second predetermined pattern data PTD2 based on a four-phase clock signal CLK_4P including the plurality of read clock signals CLKI, to CLKQB and the second driver 254 may output the second read strobe signal RDQSB by driving an output of the second multiplexer 252. The second multiplexer 252 may sequentially select bits of the second predetermined pattern data PTD2 at respective rising edges of the plurality of read clock signals CLKI, to CLKQB.

For example, bits of the first predetermined pattern data PTD1 may correspond to 'H', 'L', 'H' and 'L' and bits of the second predetermined pattern data PTD2 may correspond to 'L', 'H', 'L' and 'H'. However, the present disclosure is not limited in this regard and the first predetermined pattern data PTD1 and the second predetermined pattern data PTD2 may correspond to other patterns. As used herein, 'H' may refer to a logic high level and 'L' may refer to a logic low level. Alternatively, 'H' may refer to the logic low level and 'L' may refer to the logic high level. Each bit of the first predetermined pattern data PTD1 may be complementary with a respective bit of the second predetermined pattern data PTD2. As a result, the first read strobe signal RDQS and the second read strobe signal RDQSB may have a phase difference of 180 degrees.

Figure 8:
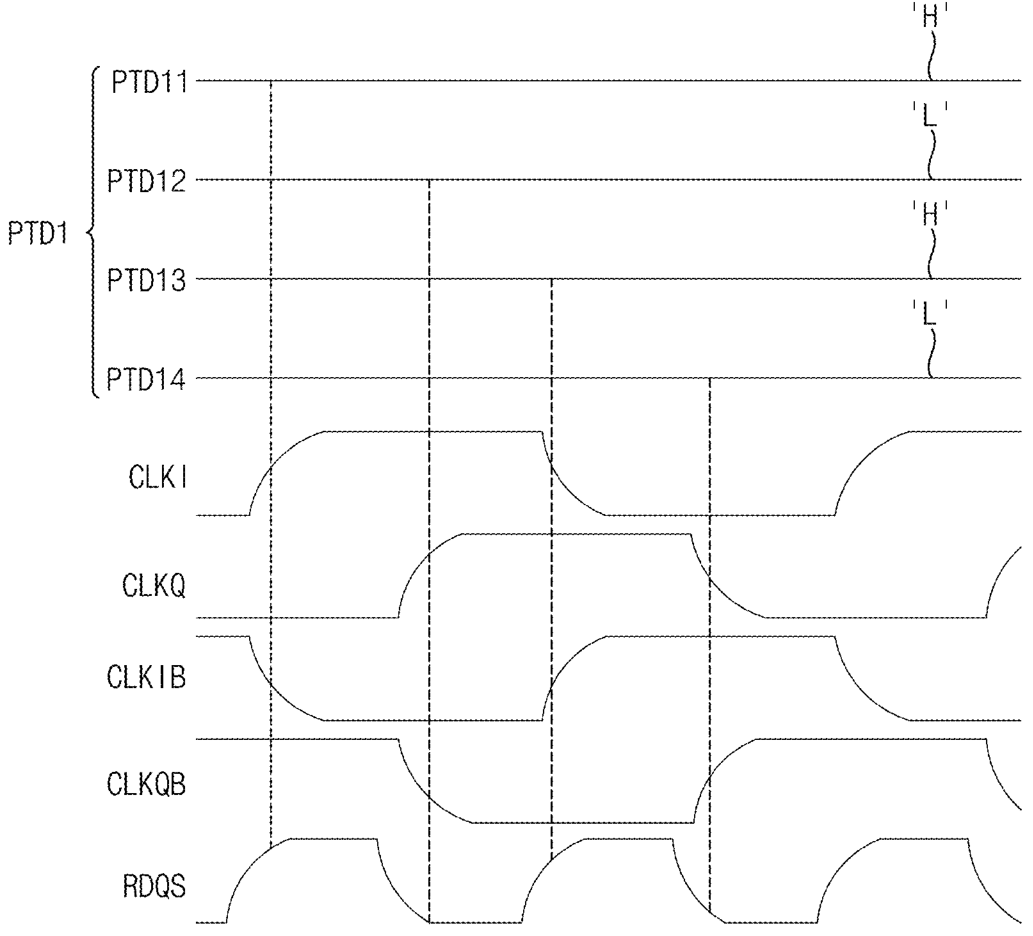
FIG. 8 is a timing diagram illustrating an example operation of the RDQS generation circuit of FIG. 7, according to example embodiments.

FIG. 8 is a timing diagram illustrating an example operation of the RDQS generation circuit of FIG. 7, according to example embodiments.

Referring to FIGS. 7 and 8, when the bits of the first predetermined pattern data PTD1 correspond to 'H', 'L', 'H' and 'L', the first multiplexer 251 may output the first read strobe signal RDQS by sequentially selecting the bits of the first predetermined pattern data PTD1 at respective rising edges of the plurality of read clock signals CLKI, to CLKQB. As a result, the first read strobe signal RDQS may have same bits as the bits of the first predetermined pattern data PTD1 and a frequency of the first read strobe signal RDQS may be two (2) times greater than a frequency of each of the plurality of read clock signals CLKI, to CLKQB.

FIG. 8 illustrates that the first read strobe signal RDQS is generated. In an embodiment, each bit of the first predetermined pattern data PTD1 may be complementary with a respective bit of the second predetermined pattern data PTD2, and as a result, the first read strobe signal RDQS and the second read strobe signal RDQSB may have a phase difference of 180 degrees.

FIG. 9 illustrates examples of the first predetermined pattern data and the second predetermined pattern data in the strobe signal generation circuit of FIG. 7, according to example embodiments.

Referring to FIGS. 7 and 9, each bit of the first predetermined pattern data PTD1 may be complementary with a respective bit of the second predetermined pattern data PTD2.

The first predetermined pattern data PTD1 having bits of 'H', 'L', 'H' and 'L' and the second predetermined pattern data PTD2 having bits of 'L', 'H', 'L' and 'H' may be referred to as default pattern data.

Each phase of first read strobe signal RDQS and the second read strobe signal RDQSB may be determined by the first predetermined pattern data PTD1 and the second predetermined pattern data PTD2 at a rising edge of each of the plurality of read clock signals CLKI, to CLKQB.

Figure 10:
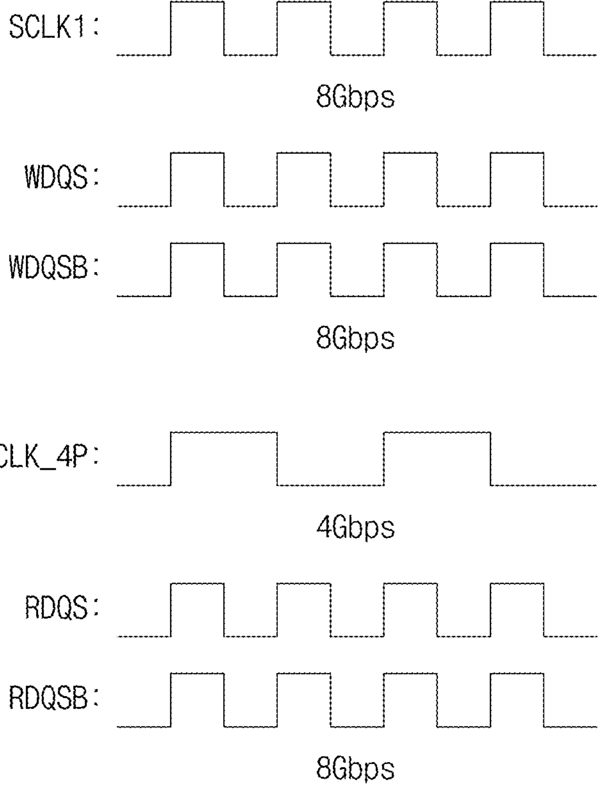
FIG. 10 illustrates frequencies of the clock signals buffer die of FIG. 3, according to example embodiments.

FIG. 10 illustrates frequencies of the clock signals buffer die of FIG. 3, according to example embodiments.

Referring to FIGS. 3, 4, and 10, when the frequency of the first source clock signal SCLK1 generated by the oscillator 212 is about 8 gigabits per second (Gbps), for example, each frequency of the first write strobe signal WDQS and the second write strobe signal WDQSB may be about 8 Gbps, each frequency of the plurality of read clock signals CLKI, to CLKQB included in the four-phase clock signal CLK_4P may be about 4 Gbps, and each frequency of the of first read strobe signal RDQS and the second read strobe signal RDQSB may be about 8 Gbps.

Figure 11:
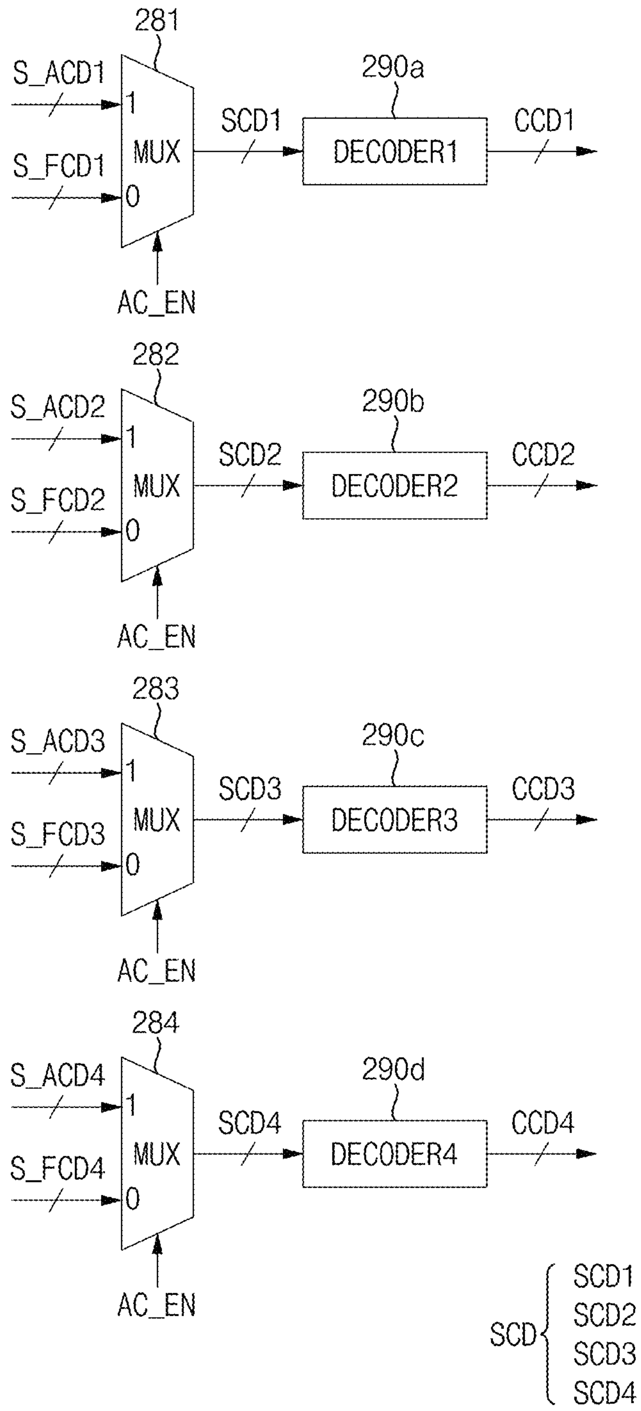
FIG. 11 is a block diagram illustrating an example of the delay controller in the buffer die of FIG. 3, according to example embodiments.

FIG. 11 is a block diagram illustrating an example of the delay controller in the buffer die of FIG. 3, according to example embodiments.

Referring to FIG. 11, the delay controller 280 may include a first multiplexer 281, a second multiplexer 282, a third multiplexer 283, a fourth multiplexer 284, a first decoder 290*a*, a second decoder 290*b*, a third decoder 290*c*, and a fourth decoder 290*d*.

The first multiplexer 281 may output a first selected calibration code SCD1 by selecting at least one of a first auto sub-code S_ACD1 of the auto calibration code ACD or a first fuse sub-code S_FCD1 of the fuse calibration code FCD, based on the auto calibration code enable signal AC_EN. The first decoder 290*a* may generate the first control code set CCD1 by decoding the first selected calibration code SCD1. The first auto sub-code S_ACD1 and the first fuse sub-code S_FCD1 may be associated with a duty cycle of the first divided clock signal DCLKI.

The second multiplexer 282 may output a second selected calibration code SCD2 by selecting at least one of a second auto sub-code S_ACD2 of the auto calibration code ACD or a second fuse sub-code S_FCD2 of the fuse calibration code FCD, based on the auto calibration code enable signal AC_EN. The second decoder 290*b* may generate the second control code set CCD2 by decoding the second selected calibration code SCD2. The second auto sub-code S_ACD2 and the second fuse sub-code S_FCD2 may be associated with a duty cycle of the second divided clock signal DCLKQ.

The third multiplexer 283 may output a third selected calibration code SCD3 by selecting at least one of a third auto sub-code S_ACD3 of the auto calibration code ACD or a third fuse sub-code S_FCD3 of the fuse calibration code FCD, based on the auto calibration code enable signal AC_EN. The third decoder 290*c* may generate the third control code set CCD3 by decoding the third selected calibration code SCD3. The third auto sub-code S_ACD3 and the third fuse sub-code S_FCD3 may be associated with a duty cycle of the third divided clock signal DCLKIB.

The fourth multiplexer 284 may output a fourth selected calibration code SCD4 by selecting at least one of a fourth auto sub-code S_ACD4 of the auto calibration code ACD or a fourth fuse sub-code S_FCD4 of the fuse calibration code FCD, based on the auto calibration code enable signal AC_EN. The fourth decoder 290*d* may generate the fourth control code set CCD4 by decoding the fourth selected calibration code SCD4. The fourth auto sub-code S_ACD4 and the fourth fuse sub-code S_FCD4 may be associated with a duty cycle of the fourth divided clock signal DCLKIQ.

Each of the first multiplexer 281, the second multiplexer 282, the third multiplexer 283, and the fourth multiplexer 284 may select a respective one of the first auto sub-code S_ACD1, the second auto sub-code S_ACD2, the third auto sub-code S_ACD3, and the fourth auto sub-code S_ACD4 in response to the auto calibration code enable signal AC_EN being activated (e.g., when the auto calibration code enable signal AC_EN has a logic high level) and may select a respective one of the first fuse sub-code S_FCD1, the second fuse sub-code S_FCD2, the third fuse sub-code S_FCD3, and the fourth fuse sub-code S_FCD4 in response to the auto calibration code enable signal AC_EN being deactivated (e.g., when the auto calibration code enable signal AC_EN has a logic low level).

The first auto sub-code S_ACD1, the second auto sub-code S_ACD2, the third auto sub-code S_ACD3, and the fourth auto sub-code S_ACD4 may be included in the auto calibration code ACD described with reference to FIG. 3. The first fuse sub-code S_FCD1, the second fuse sub-code S_FCD2, the third fuse sub-code S_FCD3, and the fourth fuse sub-code S_FCD4 may be included in the fuse calibration code FCD described with reference FIG. 3. The first selected calibration code SCD1, the second selected calibration code SCD2, the third selected calibration code SCD3 and the fourth selected calibration code SCD4 may be included in a selected calibration code SCD.

Figure 12:
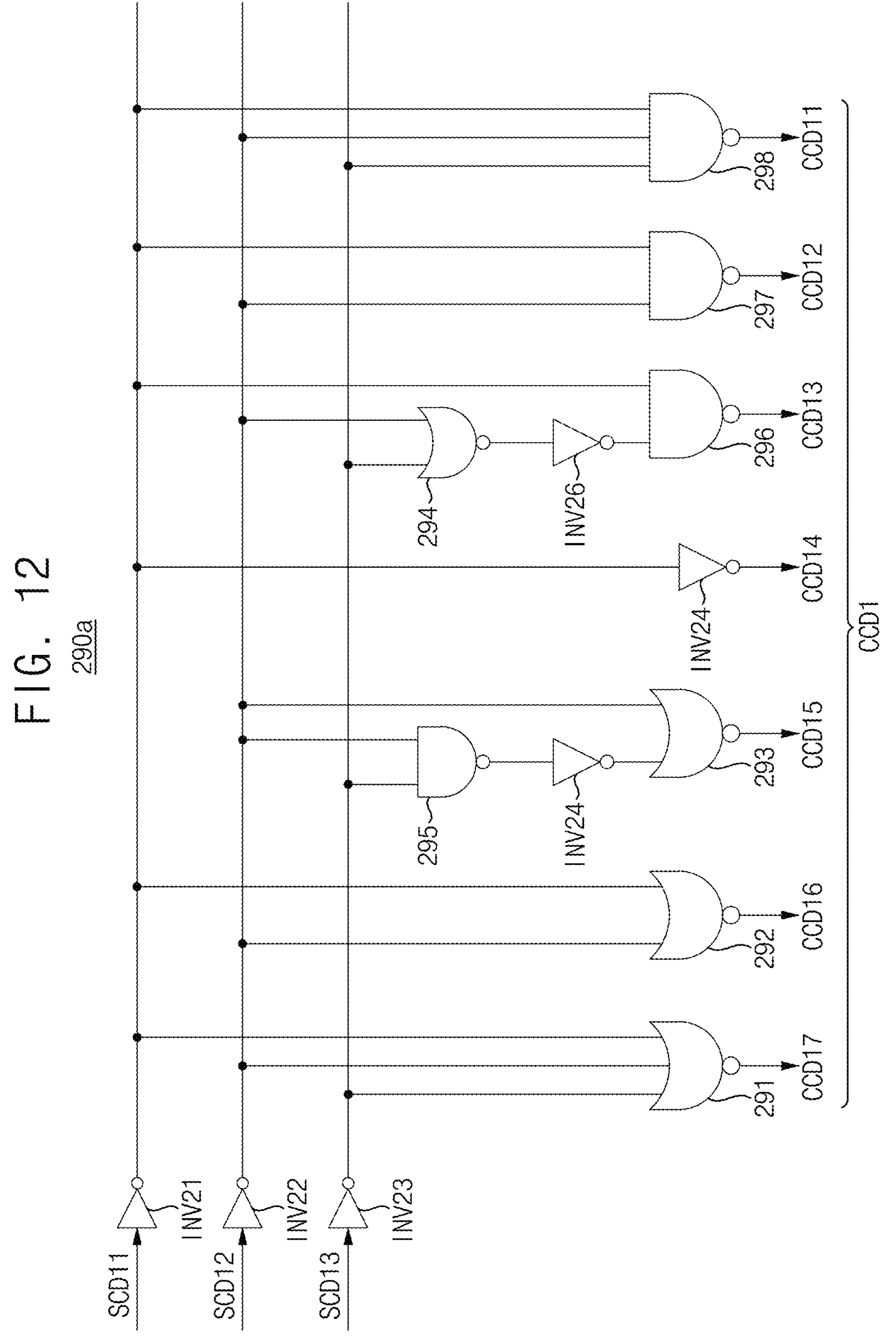
FIG. 12 is a circuit diagram illustrating an example of the first decoder in the delay controller of FIG. 11, according to example embodiments.

FIG. 12 is a circuit diagram illustrating an example of the first decoder in the delay controller of FIG. 11, according to example embodiments.

Referring to FIG. 12, the first decoder 290*a* may include a plurality of inverters (e.g., a first inverter INV21, a second inverter INV22, a third inverter INV23, a fourth inverter INV24, a fifth inverter INV25, a sixth inverter INV26, and a seventh inverter INV27), a plurality of NOR gates (e.g., a first NOR gate 291, a second NOR gate 292, a third NOR gate 293, and a fourth NOR gate 294), and a plurality of NAND gates (e.g., a first NAND gate 295, a second NAND gate 296, a third NAND gate 297, and a fourth NAND gate 298).

The first inverter INV21 may invert a first bit SCD11 of the first selected calibration code SCD1. The inverter second INV22 may invert a second bit SCD12 of the first selected calibration code SCD1. The inverter third INV23 may invert a third bit SCD13 of the first selected calibration code SCD1.

The first NOR gate 291 may output the seventh bit CCD17 of the first control code set CCD1 by performing a NOR operation on outputs of the first inverter INV21, the second inverter INV22, and the third inverter INV23. The second NOR gate 292 may output the sixth bit CCD16 of the first control code set CCD1 by performing a NOR operation on outputs of the first inverter INV21 and the second inverter INV22. The first NAND gate 295 may perform a NAND operation on outputs of the second inverter INV22 and the third inverter INV23, the fourth inverter INV24 may invert an output of the first NAND gate 295 and the third NOR gate 293 may output the fifth bit CCD15 of the first control code set CCD1 by performing a NOR operation on outputs of the second inverter INV22 and the fourth inverter INV24.

The fourth inverter INV24 may output the fourth bit CCD14 of the first control code set CCD1 by inverting an output of the first inverter INV21. The fourth NOR gate 294 may perform a NOR operation on the outputs of the second inverter INV22 and the third inverter INV23, the sixth inverter INV26 may invert an output of the fourth NOR gate 294, and the second NAND 296 gate may output the third bit CCD13 of the first control code set CCD1 by performing a NAND operation on outputs of the first inverter INV21 and the sixth inverter INV26. The third NAND gate 297 may output the second bit CCD12 of the first control code set CCD1 by performing a NAND operation on outputs of the first inverter INV21 and the second inverter INV22. The fourth NAND gate 298 may output the first bit CCD11 of the first control code set CCD1 by performing a NAND operation on outputs of the first inverter INV21, the second inverter INV22, and the third inverter INV23.

The first decoder 290*a* may generate the first control code set CCD1 including seven (7) bits by decoding three (3) bits of the first selected calibration code SCD1.

Although a configuration of the first decoder 290*a* in the delay controller 280 of FIG. 11 is illustrated in FIG. 12, each configuration of the second decoder 290*b*, the third decoder 290*c*, and the fourth decoder 290*d* may be substantially similar and/or the same as the configuration of the first decoder 290*a*.

FIG. 13 illustrates examples of the first selected calibration code and the first control code set in the first decoder of FIG. 12, according to example embodiments.

Referring to FIGS. 12 and 13, when a binary value of the first selected calibration code SCD1 including the bits SCD11, SCD12 and SCD13 is sequentially increased from zero (e.g., '0' or '000') to seven (e.g., '7' or '111'), a number of bits having a logic high level in the first control code set CCD1 (e.g., the first bit CCD11, the second bit CCD12, the third bit CCD13, the fourth bit CCD14, the fifth bit CCD15, the sixth bit CCD16, and the seventh bit CCD17) may be sequentially increased from zero (0) to seven (7). In an embodiment, the first selected calibration code SCD1 of '100' and the first control code set CCD1 of '1111100' may be set as a default value. However, the present disclosure is not limited in this regard, and the first selected calibration code SCD1 and the first control code set CCD1 may be set to other default values. That is, the first decoder 290*a* may decode the first selected calibration code SCD1 such that a number of bits having a logic high level in the first control code set CCD1 may be sequentially increased and/or decreased from the default value.

Figure 14A:
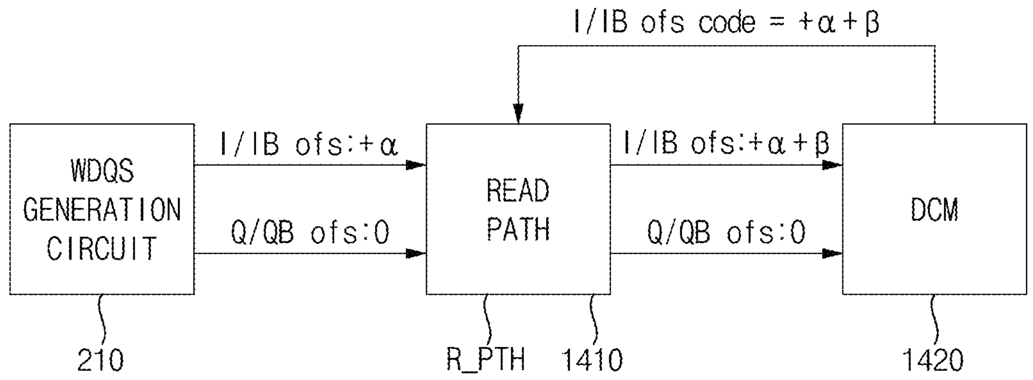
FIGS. 14A, 14B and 14C are diagrams illustrating a scheme of compensation of an offset of the WDQS generation circuit of FIG. 4, according to an embodiment.
Figure 14B:
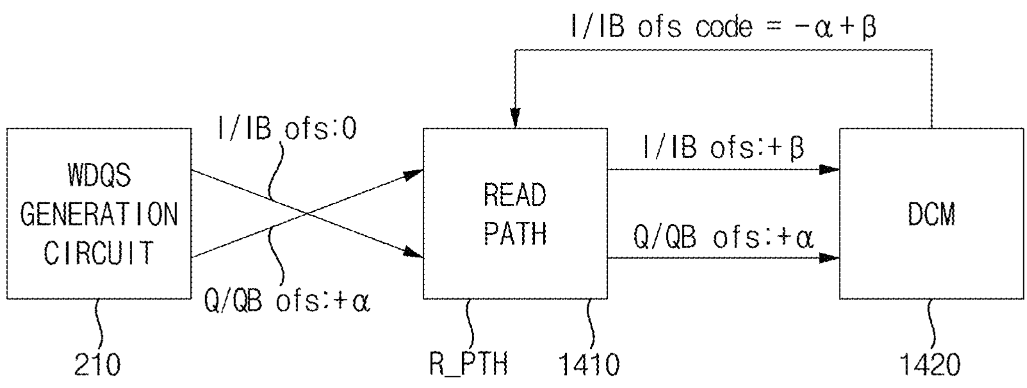
Figure 14C:
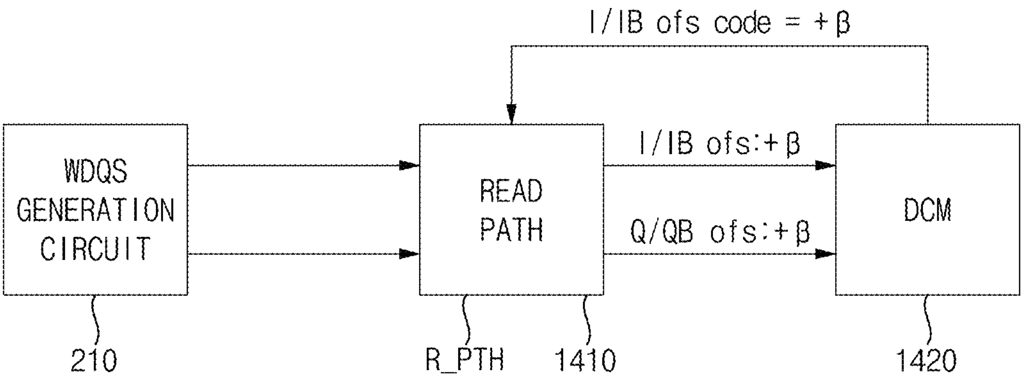

FIGS. 14A, 14B and 14C are diagrams illustrating a scheme of compensation of an offset of the WDQS generation circuit of FIG. 4, according to example embodiments.

In FIGS. 14A, 14B and 14C, I/IB ofs may refer to an offset between a first signal and a third signal having a phase difference of 180 degrees, Q/QB ofs may refer to an offset between a second signal and a fourth signal having a phase difference of 180 degrees, a read path R_PTH 1410 may refer to a path provided by the dividing and converting circuit 230, the duty cycle adjusting circuit 240, the clock tree 245, the read strobe signal RDQS generation circuit 250, and the skew monitoring circuit 260 in FIG. 3, and duty cycle monitor (DCM) 1420 may refer to the first duty cycle monitor 261 and the second duty cycle monitor 271 in FIG. 3. In addition, $+\alpha$ may refer to an offset of the WDQS generation circuit 210 and $+\beta$ may refer to an offset of the read path R_PTH 1410.

Referring to FIG. 14A, when the flipping is deactivated in response to the second selection signal SS2 having a logic low level, the first signal and the third signal of the WDQS generation circuit 210 may have an offset of $+\alpha$ and the first signal and the third signal of the read path R_PTH 1410 may have an offset of $+\alpha+\beta$. Therefore, the DCM 1420 may monitor a duty cycle such that second signal and the fourth signal of the read path R_PTH 1410 may have an offset of $+\alpha+\beta$.

Referring to FIG. 14B, when the flipping is activated in response to the second selection signal SS2 having a logic high level, the first signal and the third signal of the WDQS generation circuit 210 have an offset of zero (e.g., '0'), the second signal and the fourth signal of the WDQS generation circuit 210 may have an offset of $+\alpha$, and the second signal and the fourth signal of the read path R_PTH 1410 may have an offset of $+\alpha$. Therefore, the DCM 1420 may monitor a duty cycle such that second signal and the fourth signal of the read path R_PTH 1410 may have an offset of $-\alpha+\beta$.

Referring to FIG. 14C, when the trimming circuit 270 averages a first auto calibration code with respect to an offset $+\alpha+\beta$, obtained when the flipping is deactivated and a second auto calibration code with respect to an offset $-\alpha+\beta$, obtained when the flipping is activated, the offset of the WDQS generation circuit 210 may be cancelled, the first signal and the third signal of the read path R_PTH 1410 may have an offset of $+\beta$ and the second signal and the fourth signal of the read path R_PTH 1410 may have an offset of $+\beta$.

Figure 15:
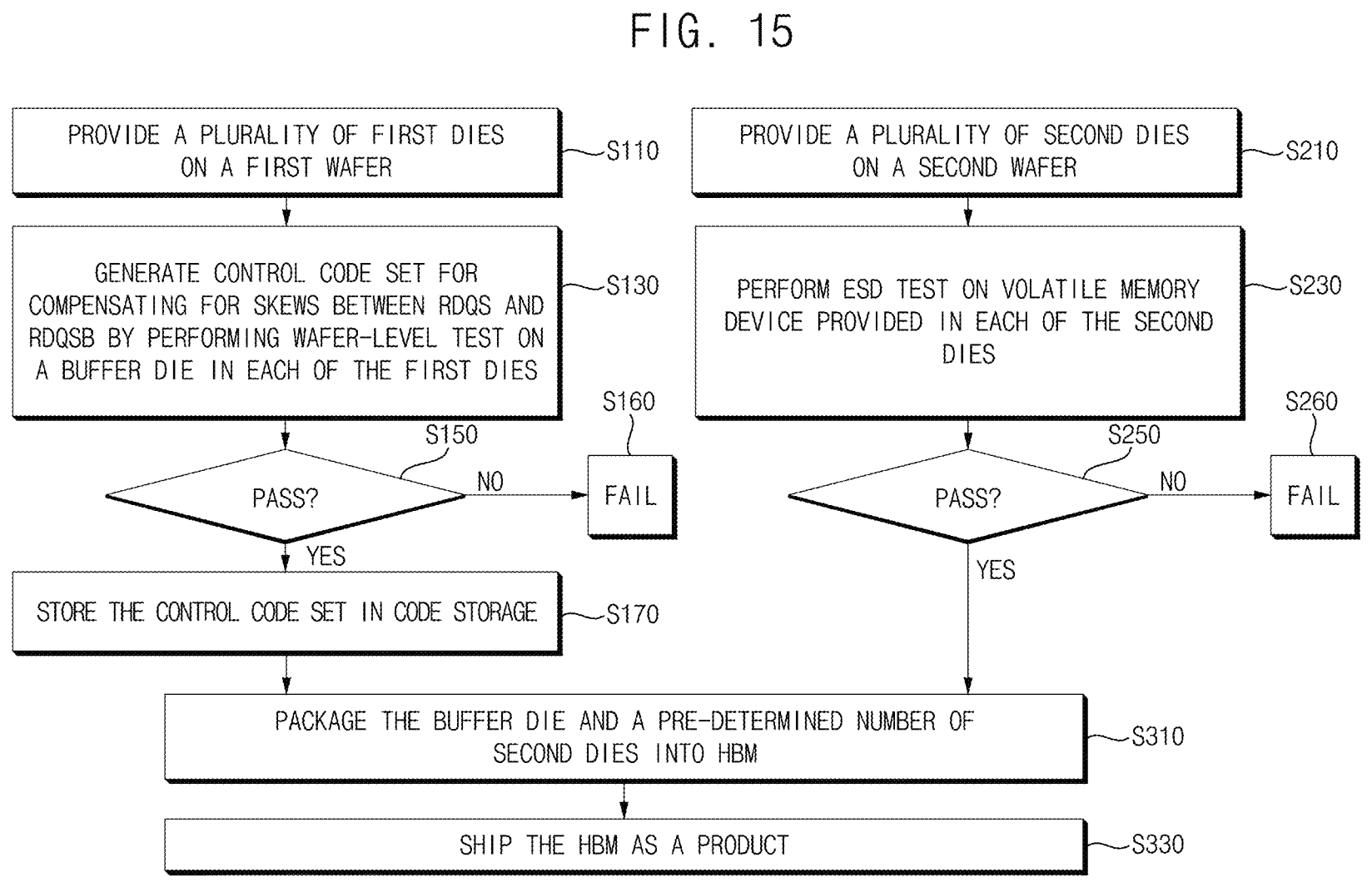

FIG. 15 is a flow chart illustrating fabrication process of a stacked memory device, according to example embodiments.

Referring to FIGS. 1 through 15, a plurality of first dies 180 may be provided on a first wafer 170 (operation S110). The ATE 40 may perform an ESD test on each of buffer dies 200 provided in the plurality of first dies 180 to generate control code sets for compensating for a skew between the first read strobe signal RDQS and the second read strobe signal in each of the buffer dies 200 (operation S130).

The ATE 40 may determine whether each of the first dies 180 passes the test based on a result of a wafer level test (operation S150).

In parallel with the operations S110, S130, and S150, a plurality of second dies may be provided on a second wafer (operation S210). An ATE may perform an ESD test on each of a plurality of volatile memory devices (e.g., core dies) provided in the second dies (operation S230). The ATE may determine whether each of the core dies passes the test based on a result of the ESD test (operation S250).

When a first die of the plurality of first dies 180 does not pass the ESD test (NO in operation S150), the corresponding first die may be processed as a failed die (operation S160). When a first die of the plurality of first dies 180 passes the ESD test (YES in operation S150), the control code sets may be stored as the fuse calibration code FCD in the second code storage 275 in the corresponding first die (operation S170).

When a second die of the plurality of second dies does not pass the ESD test (NO in operation S250), the corresponding second die may be processed as a failed die (operation S260). When a second die of the plurality of second dies passes the ESD test (YES in operation S250), the corresponding buffer die 200 passing the ESD test and a portion of the volatile memory devices passing the ESD test may be packaged into a high-bandwidth memory (HBM) (operation S310). The HBM (e.g., a stacked memory device) may be shipped as a product (operation S330).

Figure 16:
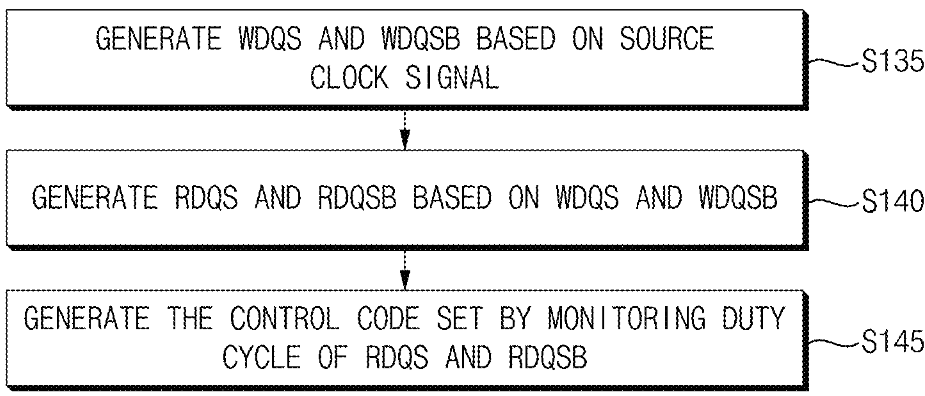
FIG. 16 is a flow chart illustrating an operation of generating the control code sets in FIG. 15, according to example embodiments.

FIG. 16 is a flow chart illustrating an operation of generating the control code sets in FIG. 15, according to example embodiments.

Referring to FIGS. 3 and 16, for generating the control code sets (operation S130), the WDQS generation circuit 210 may generate the first write strobe signal WDQS and the second write strobe signal WDQSB having a phase difference of 180 degrees based on the source clock signal SCLK (operation S135). The RDQS generation circuit 250 may generate the first read strobe signal RDQS and the second read strobe signal RDQSB having a phase difference of 180 degrees based on the first predetermined pattern data PTD1, the second predetermined pattern data PTD2, and the plurality of read clock signals CLKI, to CLKQB, which may be generated based on the first write strobe signal WDQS and the second write strobe signal WDQSB (operation S140). The trimming circuit 270 may generate the plurality of control code sets CCD1 to CCD4 based on monitoring a duty cycle between the first read strobe signal RDQS and the second read strobe signal RDQSB (operation S145).

That is, according to a fabrication process of a stacked memory device, the WDQS generation circuit 210 may be formed in each of buffer dies on a wafer in a wafer level before being packaged into a HBM, the WDQS generation circuit 210 may generate the first write strobe signal WDQS and the second write strobe signal WDQSB, and a skew between the first read strobe signal RDQS and the second read strobe signal RDQSB may be compensated for by monitoring the duty cycle of the first read strobe signal RDQS and the second read strobe signal RDQSB, which may be generated based on the first write strobe signal WDQS and the second write strobe signal WDQSB.

Figure 17:
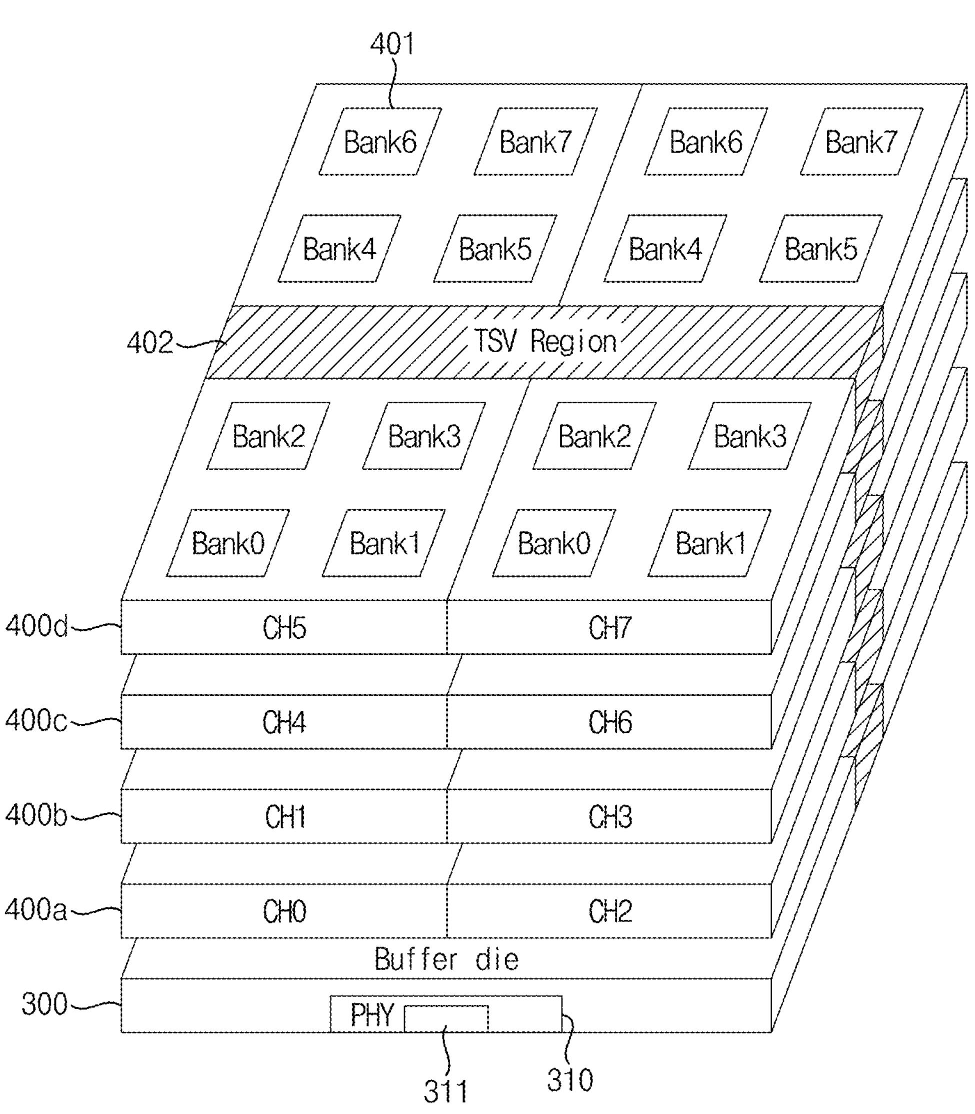
FIG. 17 is a block diagram illustrating a stacked memory device, according to example embodiments.

FIG. 17 is a block diagram illustrating a stacked memory device, according to example embodiments.

Referring to FIG. 17, a stacked memory device 70 may include a buffer die 300 and a plurality of core dies (e.g., a first core die 400*a*, a second core die 400*b*, a third core die 400*c*, and a fourth core die 400*d*). In an embodiment, the buffer die 300 may be referred to as an interface die, a base die, a logic die, a master die, or the like, and each of the plurality of core dies 400*a* to 400*d* may be referred to as a memory die, a "slave die", or the like. An Although FIG. 17 illustrates the stacked memory device 700 as having four core dies 400*a* to 400*d*, the present disclosure is not limited in this regard, and the number of core dies may be variously changed. For example, the stacked memory device 70 may include 8, 12, or 16 core dies.

The buffer die 300 and the plurality of core dies 400*a* to 400*d* may be stacked and may be electrically connected by using through silicon vias (TSV). As such, the stacked memory device 70 may have a three-dimensional (3D) memory structure in which the plurality of dies 300 and 400*a* to 400*d* may be stacked. For example, the stacked memory device 70 may be implemented in compliance with an HBM and/or a hybrid memory cube (HMC) standard.

The stacked memory device 70 may support a plurality of channels (or vaults) that may be functionally independent of each other. For example, as shown in FIG. 17, the stacked memory device 70 may support a plurality of channels (e.g., a first channel CH0, a second channel CH1, a third channel CH2, a fourth channel CH3, a fifth channel CH4, a sixth channel CH5, a seventh channel CH6, and an eighth channel CH7). In the case where each of the plurality of channels CH0 to CH7 supports 128 DQ input/outputs (I/O) s, the stacked memory device 70 may support 1024 DQ I/Os. However, the present disclosure is not limited thereto. For example, the stacked memory device 70 may support 1024 or more DQ I/Os and may support 8 or more channels (e.g., 16 channels). In the case where the stacked memory device 70 supports 16 channels, each of the plurality of channels may support 64 DQ I/Os.

Each of the plurality of core dies 400*a* to 400*d* may support at least one channel. For example, as shown in FIG. 17, the plurality of core dies 400*a* to 400*d* may support channel pairs (e.g., a first pair including the first channel CH0 and the third channel CH2, a second pair including the second channel CH1 and the fourth channel CH3, a third pair including the fifth channel CH4 and the seventh channel CH6, and a fourth pair including the sixth channel CH5 and the eighth channel CH7), respectively. In such a case, the plurality of core dies 400*a* to 400*d* may support different channels. However, the present disclosure is not limited thereto. For example, at least two of the core dies 400*a* to 400*d* may support the same channel. As another example, each of the core dies 400*a* to 400*d* may support the first channel CH0.

Each of the plurality of channels CH0 to CH7 may form an independent command and data interface. For example, channels may be independently clocked based on independent timing requirements and may not be synchronized. As another example, based on an independent command, each channel may change a power state and/or may perform a refresh operation.

Each of the plurality of channels CH0 to CH7 may include a plurality of memory banks 401. Each of the memory banks 401 may include memory cells connected with word lines and/or bit lines, a row decoder, a column decoder, a sense amplifier, or the like. For example, as shown in FIG. 17, each of the plurality of channels CH0 to CH7 may support eight 8 memory banks 401 such as a plurality of memory banks including a first memory bank Bank0, a second memory bank Bank1, a third memory bank Bank2, a fourth memory bank Bank3, a fifth memory bank Bank4, a sixth memory bank Bank5, a seventh memory bank Bank6, and an eighth memory bank Bank7. However, the present disclosure is not limited thereto. For example, each of the plurality channels CH0 to CH7 may support eight (8) or more memory banks 401. Although FIG. 17 illustrates memory banks as belonging to one channel being included in one core die, the present disclosure is not limited in this regard. For example, memory banks belonging to one channel may be distributed into a plurality of core dies. As another example, in a case where each of the plurality of core dies 400*a* to 400*d* supports the first channel CH0, memory banks included in the first channel CH0 may be distributed into the first core die 400*a*, the second core die 400*b*, the third core die 400*c*, and the fourth core die 400*d*.

In example embodiments, one channel may be divided into two pseudo channels that may operate independently from each other. For example, the pseudo channels may share a command and clock inputs (e.g., a clock signal, a clock enable signal, or the like) of the corresponding channel but may independently decode and execute commands. For example, in a case where one channel supports 128 DQ I/Os, each of the pseudo channels may support 64 DQ I/Os. As another example, in a case where one channel supports 64 DQ I/Os, each of the pseudo channels may support 32 DQ I/Os.

The buffer die 300 and the plurality of core dies 400*a* to 400*d* may each include a TSV region 402. TSVs configured to penetrate the buffer die 300 and the plurality of core dies 400*a* 400*d* may be disposed in the TSV region 402. The buffer die 300 may exchange signals and/or data with the plurality of core dies 400*a* to 400*d* through the TSVs. Each of the plurality of core dies 400$a$ to 400$d$ may exchange signals and/or data with the buffer die 300 through the TSVs, and the plurality of core dies 400$a$ to 400$d$ may exchange signals and/or data with each other through the TSVs. In such a case, the signals and/or data may be independently exchanged through the corresponding TSVs for each channel. For example, in a case where an external host device transmits a command and an address to the first channel CH0 for the purpose of accessing a memory cell of the first core die 400$a$, the buffer die 300 may transmit control signals to the first core die 400$a$ through TSVs corresponding to the first channel CH0 and may access the memory cell of the first channel CH0.

The buffer die 300 may include a physical layer PHY 310. The physical layer PHY 310 may include an interface circuit 311 for communication with the external host device. For example, the interface circuit 311 may include the WDQS generation circuit 210, the dividing and converting circuit 230, the duty cycle adjusting circuit 240, the clock tree 245, the RDQS generation circuit 250, the skew monitoring circuit 260, and the trimming circuit 270 in FIG. 3. In an embodiment, the WDQS generation circuit 210 may be disabled. Signals and/or data received through the physical layer PHY 310 may be transferred to the plurality of core dies 400$a$ to 400$d$ through the TSVs.

In example embodiments, the buffer die 300 may include channel controllers respectively corresponding to the channels. A channel controller may manage memory reference operations of the corresponding channel and may determine a timing requirement of the corresponding channel.

In example embodiments, the buffer die 300 may include a plurality of pins for receiving signals from the external host device. Through the plurality of pins, the buffer die 300 may receive a clock signal CK, a command/address signal, a write data strobe signal, and data signal DQ and may transmit a read data strobe signal and the data signal. For example, the buffer die 300 may include two (2) pins for receiving the clock signal, fourteen (14) pins for receiving the command/address signal, eight (8) pins for receiving the write data strobe signal, eight (8) pins for transmitting the read data strobe signal, and 128 pins for transmitting and/or receiving the data signal, for each channel. However, the present disclosure is not limited in this regard.

Figure 18:
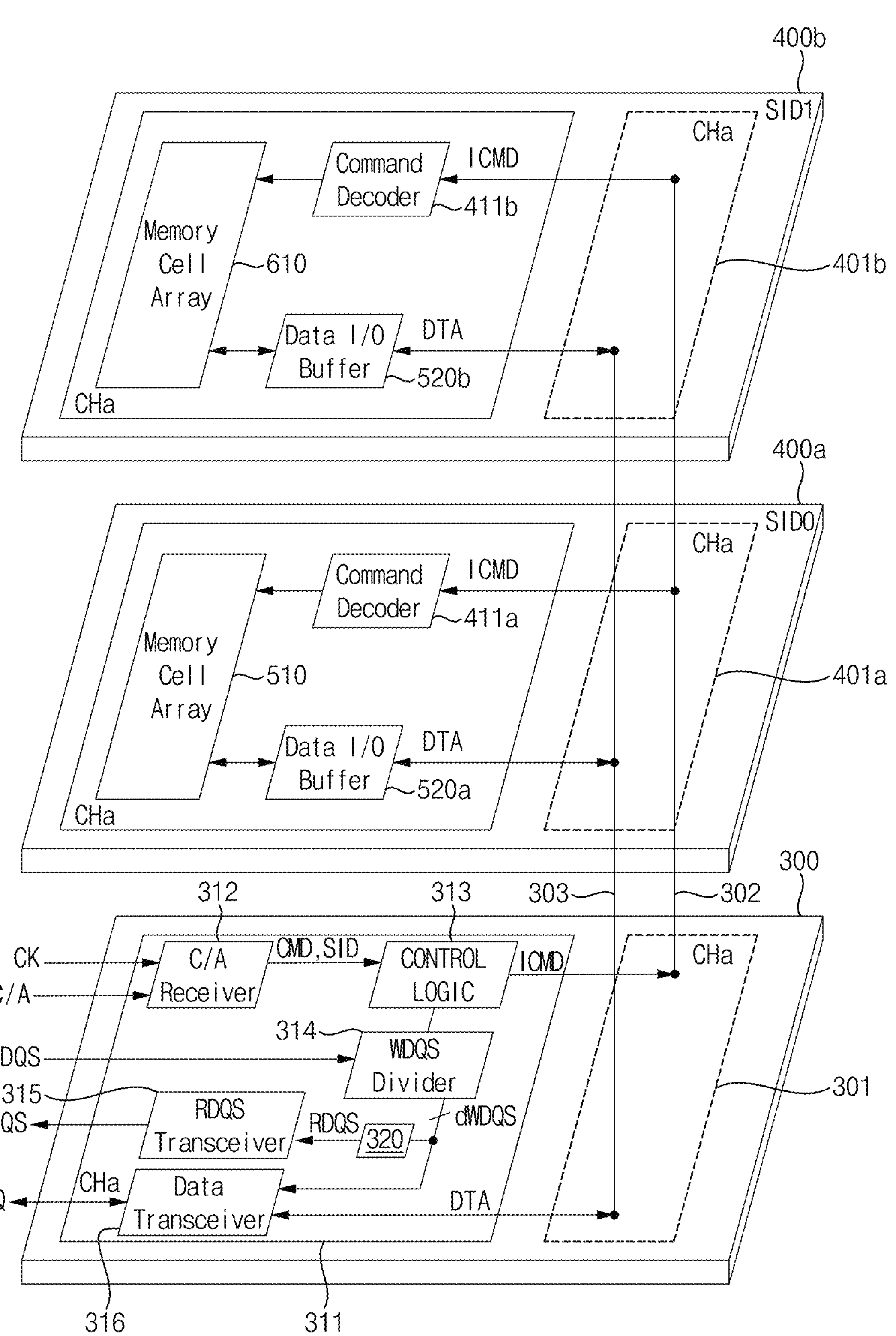
FIG. 18 is a block diagram illustrating an example of the stacked memory device of FIG. 17, according to example embodiments.

FIG. 18 is a block diagram illustrating an example of the stacked memory device of FIG. 17, according to example embodiments.

Referring to FIG. 18, a stacked memory device 70$a$ may include a buffer die 300, a first core die 400$a$ and a second core die 400$b$. The first core die 400$a$ and the second core die 400$b$ may support a same channel CHa of a plurality of channels. In such a case, the first core die 400$a$ and the second core die 400$b$ may be distinguishable by using a stack identifier SID. For example, the first core die 400$a$ may correspond to a first stack identifier SID0, and the second core die 400$b$ may correspond to a second stack identifier SID1. An example is illustrated in FIG. 18 in which another core die does not exist between the first core die 400$a$ and the second core die 400$b$. However, the present disclosure is not limited in this regard. That is, another core die may be interposed between the first core die 400$a$ and the second core die 400$b$.

The buffer die 300 and the first and second core dies 400$a$ and 400$b$ may communicate with each other through a first TSV 302 and a second TSV 303 placed in a TSV region 301. For example, the buffer die 300 may transmit an internal command ICMD to the first core die 400$a$ and/or the second core die 400$b$ through the first TSV 302 and may exchange the data DTA with the first core die 400$a$ and/or the second core die 400$b$ through the second TSV 303. An example is illustrated in FIG. 18 in which the buffer die 300 communicates with the first and second core dies 400$a$ and 400$b$ by using the same first and second TSVs 302 and 303. However, the present disclosure is not limited in this regard. For example, the buffer die 300 may communicate by using separate TSVs respectively corresponding to the first and second core dies 400$a$ and 400$b$.

The buffer die 300 may include the interface circuit 311. The interface circuit 311 may include a command/address (C/A) receiver 312, a control logic circuit 313, a WDQS divider 314, an RDQS transmitter 315, a data transceiver 316, and a RDQS generator 320. The RDQS generator 320 may include the dividing and converting circuit 230, the duty cycle adjusting circuit 240, the clock tree 245, the RDQS generation circuit 250, the skew monitoring circuit 260, and the trimming circuit 270 described with reference to FIG. 3.

The C/A receiver 312 may receive a command CMD and a stack identifier SID by latching a command/address signal C/A based on a clock signal CK. The stack identifier SID may be an address indicating at least one core die for the purpose of distinguishing core dies supporting the same channel. The received command CMD and the stack identifier SID may be provided to the control logic circuit 313.

The control logic circuit 313 may generate an internal command ICMD based on the stack identifier SID and may transmit the internal command ICMD to at least one of the first core die 400$a$ and the second core die 400$b$. For example, in a case where the stack identifier SID indicates the first stack identifier SID0, the control logic circuit 313 may transmit the internal command ICMD to the first core die 400$a$.

In an embodiment, the internal command ICMD may be generated in a format different from that of the command CMD in compliance with an internal communication protocol between the buffer die 300 and the first and second core dies 400$a$ and 400$b$ and/or may be generated in a format identical to that of the command CMD. The internal command ICMD may be transmitted through the first TSV 302 to at least one of the first and second core dies 400$a$ and 400$b$.

In example embodiments, as illustrated in FIG. 18, in a case where the internal command ICMD and the data DTA are transferred to the first and second core dies 400$a$ and 400$b$ through the common first and second TSVs 302 and 303, the buffer die 300 may transfer the stack identifier SID to the first and second core dies 400$a$ and 400$b$. The first and second core dies 400$a$ and 400$b$ may decode the transferred stack identifier SID to selectively receive the internal command ICMD and the data DTA. For example, in a case where the stack identifier SID indicates the first stack identifier SID0, the first core die 400$a$ may receive the internal command ICMD and the data DTA transferred through the first and second TSVs 302 and 303. In such a case, the second core die 400$b$ may not receive the internal command ICMD and the data DTA transferred through the first and second TSVs 302 and 303.

In example embodiments, in a case where the internal command ICMD and the data DTA are transferred to the first and second core dies 400$a$ and 400$b$ through separate TSVs, the buffer die 300 may transfer the internal command ICMD and the data DTA through separate TSVs to a core die corresponding to the stack identifier SID.

In a case where the first and second core dies 400$a$ and 400$b$ support the same channel CHa, the stacked memory device 70$a$ may perform a write operation and a read operation on at least one of the first core die 400$a$ or the second core die 400$b$ depending on the stack identifier SID.

The WDQS divider 314 may receive the write strobe signal WDQS and may generate internal write strobe signals dWDQS based on the write strobe signal WDQS. The RDQS generator 320 may generate the read strobe signal RDQS based on the internal write strobe signals dWDQS and may provide the read strobe signal RDQS to the RDQS transmitter 315.

The RDQS transmitter 315 may transmit the read strobe signal RDQS to the external host device.

The data transceiver 316 may transmit and/or receive a data signal DQ including the data DTA based on the internal write data strobe signals dWDQS. In a write operation, the data transceiver 316 may receive the data DTA by latching the data signal DQ based on the internal write data strobe signals dWDQS. The received data DTA may be transmitted through the second TSV 303 to at least one of the first and second core dies 400$a$ and 400$b$. In a read operation, the data transceiver 316 may receive the data DTA transmitted from at least one of the first and second core dies 400$a$ and 400$b$ through the second TSV 303. The data transceiver 316 may transmit the data signal DQ including the data DTA to the external host device based on the internal write data strobe signals dWDQS. The data DTA may be aligned with toggle timings of the read data strobe signal RDQS and may be transmitted.

The first core die 400$a$ may include a command decoder 411$a$, a data I/O buffer 520$a$, and a memory cell array 510. The command decoder 411$a$, the data I/O buffer 520$a$, and the memory cell array 510 may be circuits supporting the channel CHa. The command decoder 411$a$ may decode the internal command ICMD transmitted from the buffer die 300 through the first TSV 302. The command decoder 411$a$ may control the data I/O buffer 520$a$ and the memory cell array 510 depending on the internal command ICMD.

The data I/O buffer 520$a$ may exchange data DTA with the buffer die 300 through the second TSV 303. In a write operation, the data I/O buffer 520$a$ may receive the data DTA transmitted from the buffer die 300 through the second TSV 303 and may transmit the data DTA to the memory cell array 510. The memory cell array 510 may store the data DTA. In a read operation, the data I/O buffer 520$a$ may read the data DTA from the memory cell array 510 and may transmit the received data DTA to the buffer die 300 through the second TSV 303.

In example embodiments, the buffer die 300 may further include an error correction code (ECC) engine for detecting and/or correcting an error of the data DTA. For example, in the write operation, the ECC engine may generate error detection bits (e.g., parity bits) for the data DTA received through the data transceiver 316. In the read operation, the via ECC engine may detect and/or correct an error of the data DTA transferred from the first core die 400$a$ by using the error detection bits and may transfer error-corrected data DTA to the data transceiver 316.

The second core die 400$b$ may include a command decoder 411$b$, a data I/O buffer 520$b$, and a memory cell array 610. The second core die 400$b$ may be similar in many respects to the first core die 400$a$, and may include additional features not mentioned above. Consequently, repeated descriptions of the second core die 400$b$ described above with reference to the first core die 400$a$ may be omitted for the sake of brevity.

Figure 19:
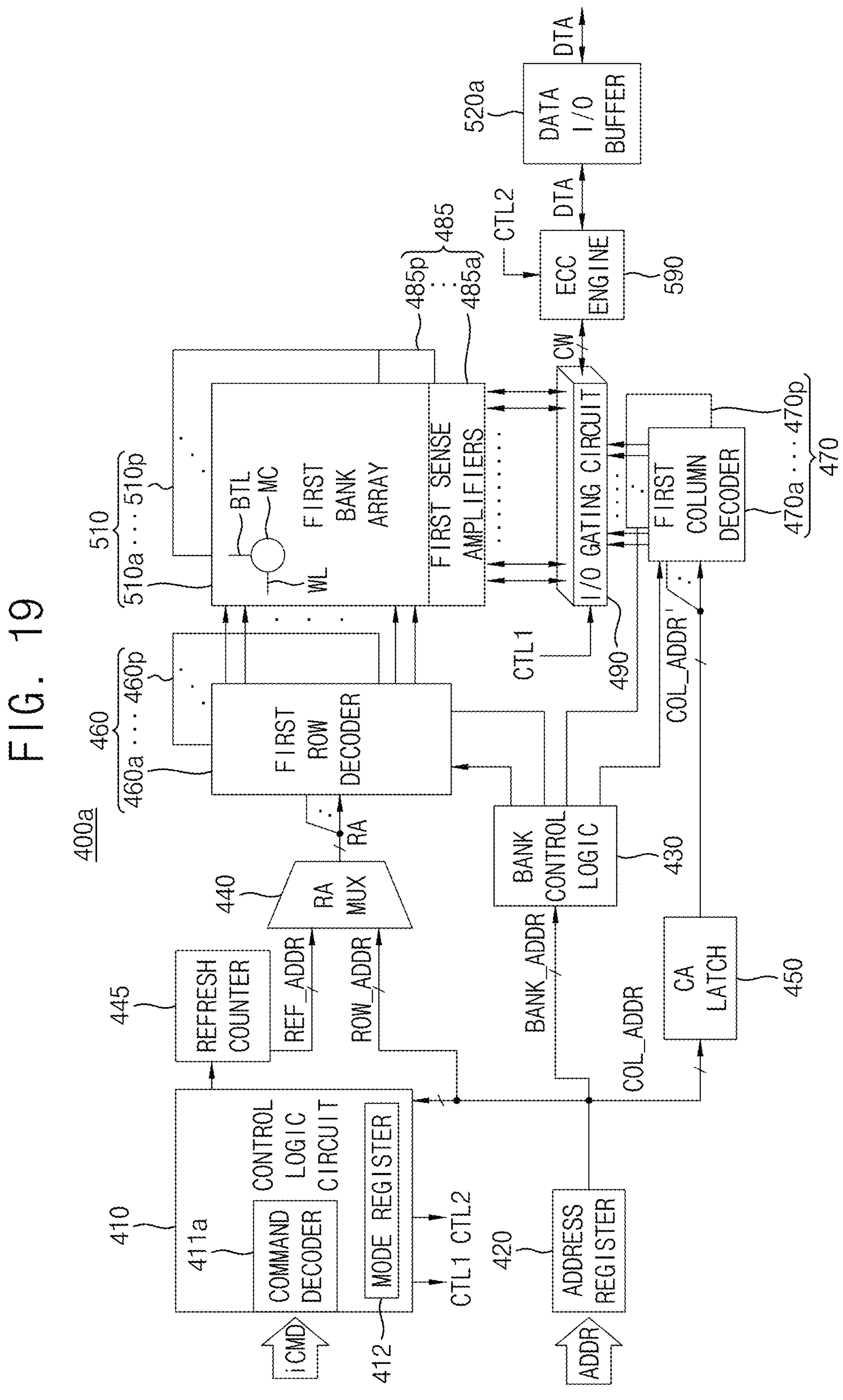
FIG. 19 is a block diagram illustrating an example of the first core die in the stacked memory device of FIG. 18, according to example embodiments.

FIG. 19 is a block diagram illustrating an example of the first core die in the stacked memory device of FIG. 18, according to example embodiments.

Referring to FIG. 19, the first core die 400$a$ may include a control logic circuit 410, an address register 420, a bank control logic 430, a row address multiplexer 440, a column address latch 450, a row decoder 460, a column decoder 470, the memory cell array 510, a sense amplifier unit 485, an input/output (I/O) gating circuit 490, a refresh counter 445, the data I/O buffer 520$a$, and an ECC engine 590.

The memory cell array 510 may include a plurality of bank arrays (e.g., a first bank array 510$a$ to a sixteenth bank array 510$p$). The row decoder 460 may include a plurality of row decoders (e.g., a first row decoder 460$a$ to a sixteenth row decoder 460$p$) respectively coupled to the plurality of bank arrays 510$a$ to 510$p$. The column decoder 470 may include a plurality of column decoders (e.g., a first column decoder 470$a$ to a sixteenth column decoder 470$p$) respectively coupled to the plurality of bank arrays 510$a$ to 510$p$. The sense amplifier unit 485 may include a plurality of sense amplifiers (e.g., a first sense amplifier 485$a$ to a sixteenth sense amplifier 485$p$) respectively coupled to the plurality of bank arrays 510$a$ to 510$p$. The plurality of bank arrays 510$a$ to 510$p$, the plurality of row decoders 460$a$ to 460$p$, the plurality of column decoders 470$a$ to 470$p$, and the plurality of sense amplifiers 485$a$ to 485$p$ may form a plurality of first through sixteenth memory banks.

Each of the plurality of bank arrays 510$a$ to 510$p$ may include a plurality of memory cells MC, formed at intersections of a plurality of word-lines WL and a plurality of bit-lines BTL.

The address register 420 may receive the address ADDR including a bank address BANK_ADDR, a row address ROW_ADDR, and a column address COL_ADDR from the buffer die 300. The address register 420 may provide the received bank address BANK_ADDR to the bank control logic 430, provide the received row address ROW_ADDR to the row address multiplexer 440, and provide the received column address COL_ADDR to the column address latch 450.

The bank control logic 430 may generate bank control signals in response to the bank address BANK_ADDR. At least one of the plurality of row decoders 460$a$ to 460$p$ corresponding to the bank address BANK_ADDR may be activated in response to the bank control signals, and at least one of the plurality of column decoders 470$a$ to 470$p$ corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output at least one of the row address ROW_ADDR or the refresh row address REF_ADDR as a row address RA. The row address RA that is output from the row address multiplexer 440 may be applied to the plurality of row decoders 460$a$ to 460$p$.

The refresh counter 445 may sequentially increase and/or decrease the refresh row address REF_ADDR under control of the control logic circuit 410.

The activated one of the plurality of row decoders 460$a$ to 460$p$ may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In example embodiments, in a burst mode, the column address latch 450 may generate column addresses COL_ADDR' that increment from the received column address COL_ADDR. The column address latch 450 may apply the temporarily stored or generated column address COL_ADDR' to the plurality of column decoders 470*a* to 470*p*.

The activated one of the plurality of column decoders 470*a* to 470*p* may decode the column address COL_ADDR' that is output from the column address latch 450, and may control the I/O gating circuit 490 to output data corresponding to the column address COL_ADDR.

The I/O gating circuit 490 may include circuitry for gating input/output data. The I/O gating circuit 490 may further include read data latches for storing data that is output from the plurality of bank arrays 510*a* to 510*p*, and write drivers for writing data to the plurality of bank arrays 510*a* to 510*p*.

A codeword CW that is read from one bank array of the plurality of bank arrays 510*a* to 510*p* may be sensed by a sense amplifier coupled to the one bank array from which the data is to be read, and may be stored in the read data latches. The codeword CW stored in the read data latches may be provided to the ECC engine 590. The ECC engine 590 may perform an ECC decoding on the codeword CW to provide the data DTA to the data I/O buffer 520*a*. The data I/O buffer 520*a* may convert the data DTA to the data signal DQ and may transmit the data signal DQ to the buffer die 300.

The data DTA to be written in one bank array of the plurality of bank arrays 510*a* to 510*p* may be provided to the ECC engine 590 from the data I/O buffer 520*a*. The ECC engine 590 may perform an ECC encoding on the data DTA to generate parity bits and the ECC engine 590 may provide the data DTA and the parity bits to the I/O gating circuit 490. The I/O gating circuit 490 may write the data DTA and the parity bits in a sub-page in one bank array through the write drivers.

The ECC engine 590 may perform an ECC encoding and/or ECC decoding on the data DTA based on a second control signal CTL2 from the control logic circuit 410.

The control logic circuit 410 may control operations of the first core die 400*a*. For example, the control logic circuit 410 may generate control signals for the first core die 400*a* in order to perform a write operation and a read operation The control logic circuit 410 may include a command decoder 411*a* that decodes the internal command ICMD received from the buffer die 300, and may include a mode register 412 that may set an operation mode of the first core die 400*a*.

The control logic circuit 410 may generate a first control signal CTL1 to control the I/O gating circuit 490, and may generate the second control signal CTL2 to control the ECC engine 590 by decoding the internal command ICMD.

Figure 20:
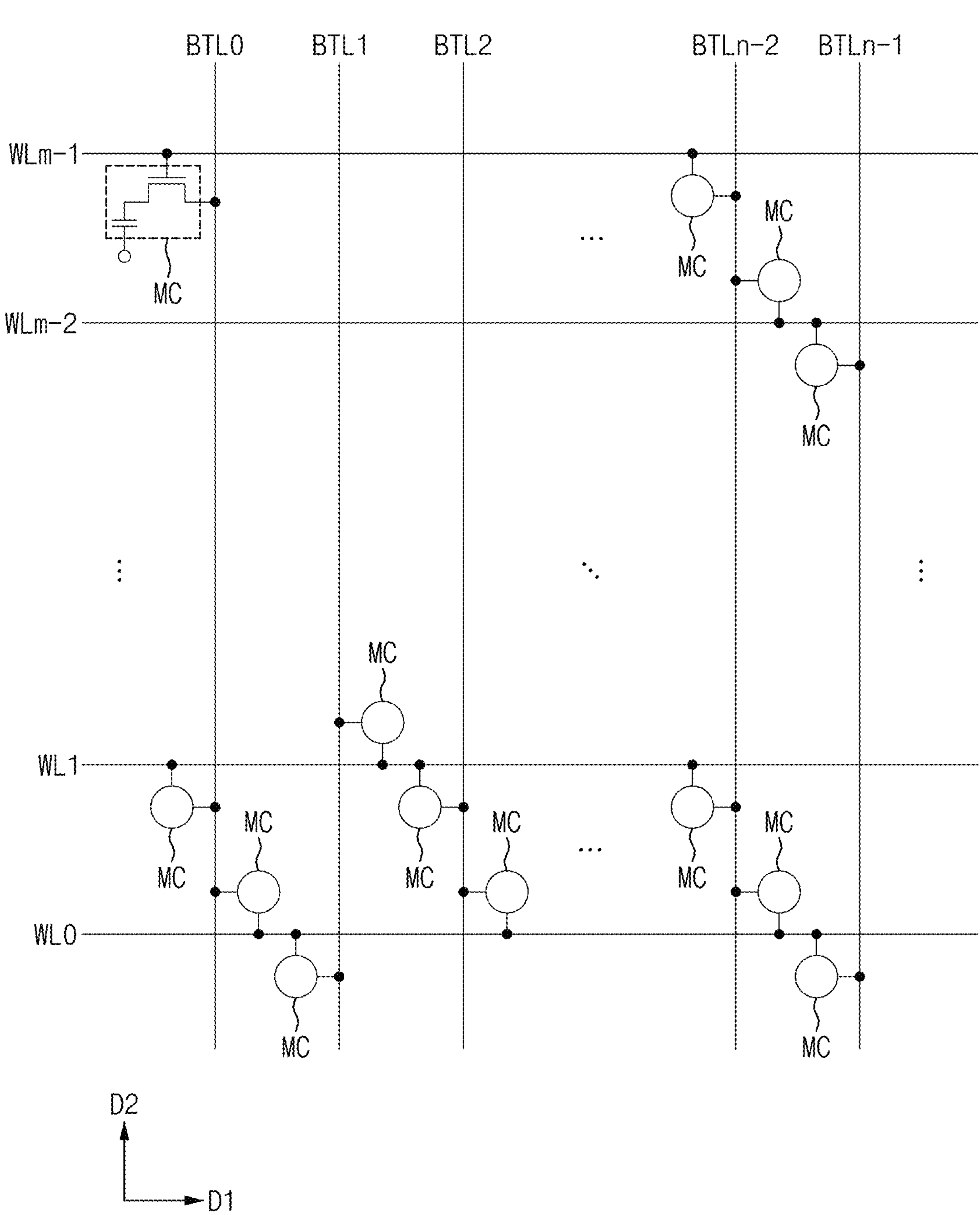
FIG. 20 illustrates an example of a first bank array in the first core die of FIG. 19, according to example embodiments.

FIG. 20 illustrates an example of a first bank array in the first core die of FIG. 19, according to example embodiments.

Referring to FIG. 20, the first bank array 510*a* may include a plurality of word-lines (e.g., a first word-line WL0, a second word-line WL1, to a (m−2)-th word-line WLm−2, and a (m−1)-th word-line WLm-1, where m is a positive integer greater than two (2)), a plurality of bit-lines (e.g., a first bit-line BTL0, a second bit-line BTL1, a third bit-line BTL2, to a (n−2)-th bit-line BTLn−2, and a (n−1)-th bit-line BTLn−1, where n is a positive integer greater than two (2)), and a plurality of memory cells MCs disposed at intersections between the plurality of word-lines WL0 to WLm−1 and the plurality of bit-lines BTL0 to BTLn−1. Each of the plurality of memory cells MCs may include a cell transistor coupled to each of the plurality of word-lines WL0 to WLm−1 and each of the plurality of bit-lines BTL0 to BTLn−1, and a cell capacitor coupled to the cell transistor. Each of the memory cells MCs may have a dynamic random access memory (DRAM) cell structure. Each of the plurality of word-lines WL0 to WLm−1 may extend in a first direction D1 and each of the plurality of bit-lines BTL1 to BTLn−1 may extend in a second direction D2 crossing the first direction D1.

The plurality of word-lines WL0 to WLm−1 coupled to the plurality of memory cells MCs may be referred to as rows of the first bank array 510*a* and the plurality of bit-lines BTL0 to BTLn−1 coupled to the plurality of memory cells MCs may be referred to as columns of the first bank array 510*a*.

Figure 21:
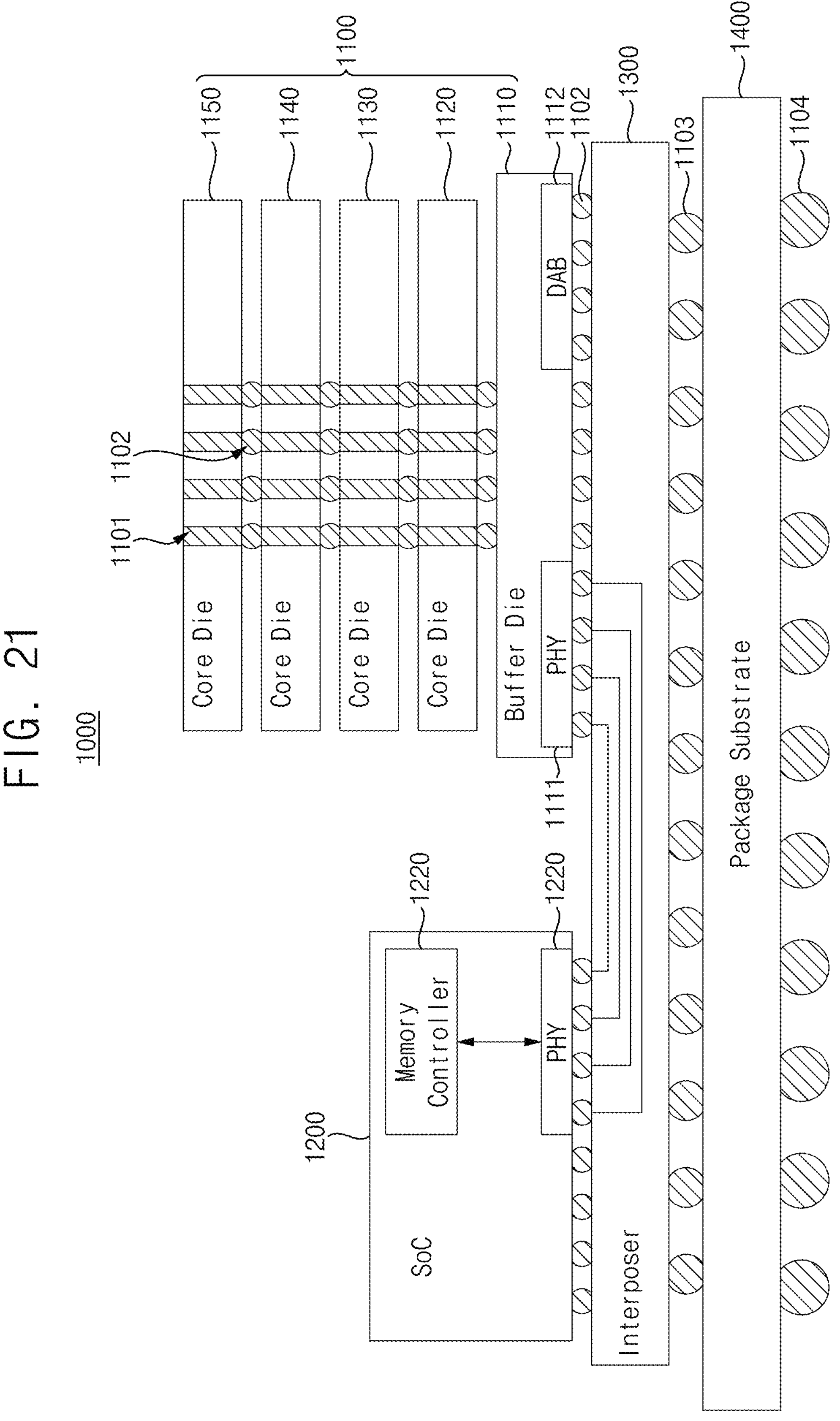
FIG. 21 is a diagram illustrating a semiconductor package, according to example embodiments.

FIG. 21 is a diagram illustrating a semiconductor package, according to example embodiments.

Referring to FIG. 21, a semiconductor package 1000 may include a stacked memory device 1100, a system on a chip (SoC) 1200, an interposer 1300, and a package substrate 1400. The stacked memory device 1100 may include a buffer die 1110 and a plurality of core dies (e.g., a first core die 1120, a second core die 1130, a third core die 1140, and a fourth core die 1150). The buffer die 1110 may correspond to the buffer die 300 of FIG. 17, and the plurality of core dies 1120 to 1150 may correspond to the plurality of core dies 400*a* to 400*d* of FIG. 17, respectively.

Each of the plurality of core dies 1120 to 1150 may include a memory cell array. The buffer die 1110 may include a physical layer 1111 and a direct access region DAB 1112. The physical layer 1111 may be electrically connected with a physical layer 1210 of the SoC 1200. Through the physical layer 1111, the stacked memory device 1100 may receive signals from the SoC 1200 and/or may transmit signals to the SoC 1200. The physical layer 1111 may include an interface circuit of the buffer die 300 as described with reference to FIG. 18.

The direct access region 1112 may provide an access path capable of testing the stacked memory device 1100 without passing through the SoC 1200. The direct access region 1112 may include a conduction means (e.g., a port or a pin) capable of directly communicating with an external test device. A test signal and data received through the direct access region 1112 may be transmitted to the plurality of core dies 1120 to 1150 through TSVs. To test the plurality of core dies 1120 to 1150, data read from the plurality of core dies 1120 to 1150 may be transmitted to the test device through the TSVs and the direct access region 1112. As such, a direct access test may be performed with respect to the plurality of core dies 1120 to 1150.

The buffer die 1110 and the plurality of core dies 1120 to 1150 may be electrically connected through TSV 1101 and bumps 1102. The buffer die 1110 may receive signals, which may be provided to each channel through the bumps 1102 allocated for each channel, from the SoC 1200. For example, the bumps 1102 may be and/or may include micro-bumps.

The SoC 1200 may execute applications that the semiconductor package 1000 supports, by using the stacked memory device 1100. For example, the SoC 1200 may include, but not be limited to, at least one of a central processing unit (CPU), an application processor (AP), a graphic processing unit (GPU), a neural processing unit (NPU), a tensor processing unit (TPU), a vision processing unit (VPU), an image signal processor (ISP), a digital signal processor (DSP), or the like, and may execute specialized calculations.

The SoC 1200 may include the physical layer 1210 and a memory controller 1220. The physical layer 1210 may include I/O circuits for exchanging signals with the physical layer 1111 of the stacked memory device 1100. The SoC 1200 may provide various signals to the physical layer 1111 through the physical layer 1210. The signals provided to the physical layer 1111 may be transferred to the plurality of core dies 1120 to 1150 through the interface circuits of the physical layer 1111 and the TSVs 1101.

The memory controller 1220 may control overall operations of the stacked memory device 1100. The memory controller 1220 may provide the stacked memory device 1100 with signals for controlling the stacked memory device 1100, through the physical layer 1210.

The interposer 1300 may connect the stacked memory device 1100 and the SoC 1200. The interposer 1300 may connect the physical layer 1111 of the stacked memory device 1100 and the physical layer 1210 of the SoC 1200 and may provide physical paths formed by using conductive materials. As such, the stacked memory device 1100 and the SoC 1200 may be stacked on the interposer 1300 and may exchange signals with each other.

The bumps 1103 may be attached on an upper surface of the package substrate 1400, and solder balls 1104 may be attached on a lower surface of the package substrate 1400. For example, the bumps 1103 may be and/or may include flip-chip bumps. The interposer 1300 may be stacked on the package substrate 1400 through the bumps 1103. The semiconductor package 1000 may exchange signals with another external package or semiconductor devices through the solder balls 1104. For example, the package substrate 1400 may be a printed circuit board (PCB).

Figure 22:
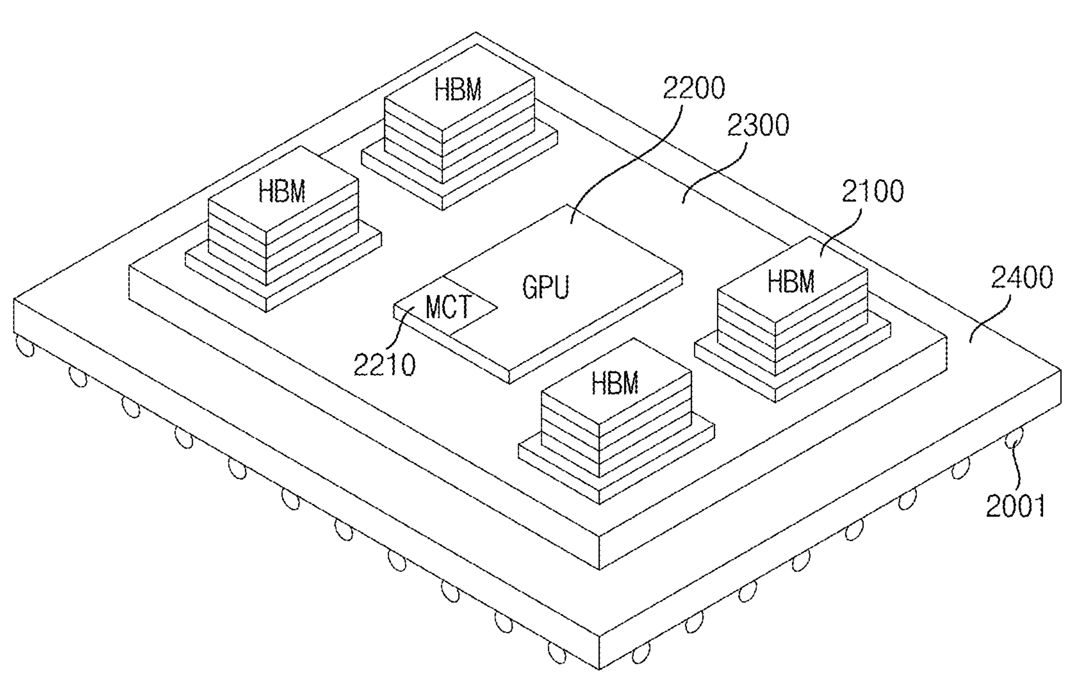
FIG. 22 is a diagram illustrating an implementation example of a semiconductor package, according to example embodiments.

FIG. 22 is a diagram illustrating an implementation example of a semiconductor package, according to example embodiments.

Referring to FIG. 22, a semiconductor package 2000 may include a plurality of stacked memory devices HBM 2100 and a GPU 2200. The plurality of stacked memory devices HBM 2100 and the GPU 2200 may be stacked on an interposer 2300, and the interposer 2300 may be stacked on a package substrate 2400. The semiconductor package 2000 may exchange signals with any other external package or semiconductor devices through solder balls 2001 attacked on a lower surface of the package substrate 2400.

Each of the plurality of stacked memory devices HBM 2100 may be implemented in compliance with a HBM standard. However, the present disclosure is not limited thereto. For example, each of the plurality of stacked memory devices HBM 2100 may be implemented based on a graphics double data rate (GDDR), hybrid memory cube (HMC), or Wide I/O standard.

The GPU 2200 may include a memory controller MCT 2210.

Example embodiments may be applied to systems using semiconductor memory devices and stacked memory devices.

While the present disclosure has been shown and described with reference to example embodiments thereof, it is to be apparent to those of ordinary skill in the art that many modifications in form and details may be made thereto without materially departing from the spirit and scope of the present disclosure as set forth by the following claims.

What is claimed is:

1. A buffer die provided in a wafer, the buffer die comprising:

a write strobe signal generation circuit configured to, based on being enabled in a wafer level test on the buffer die, generate a first write strobe signal and a second write strobe signal having a first phase difference of 180 degrees from the first write strobe signal;

a dividing and converting circuit configured to generate a plurality of divided clock signals comprising a first divided clock signal, a second divided clock signal, a third divided clock signal, and a fourth divided clock signal, the plurality of divided clock signals having a second phase difference of 90 degrees with respect to each other, the generating of the plurality of divided clock signals comprising dividing the first write strobe signal and the second write strobe signal, and converting one or more levels of the divided write strobe signals;

a duty cycle adjusting circuit configured to generate a plurality of adjusted clock signals comprising a first adjusted clock signal, a second adjusted clock signal, a third adjusted clock signal, and a fourth adjusted clock signal, the generating of the plurality of adjusted clock signals comprising adjusting a duty cycle of each of the plurality of divided clock signals based on a corresponding control code set of a plurality of control code sets comprising a first control code set, a second control code set, a third control code set, and a fourth control code set;

a read strobe signal generation circuit configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree;

a skew monitoring circuit configured to generate a first up/down signal by monitoring a first duty cycle of the first read strobe signal and a second duty cycle of the second read strobe signal; and a trimming circuit configured to:

generate a second up/down signal by monitoring duty cycles of the plurality of read clock signals;

generate the plurality of control code sets based on at least one of an auto calibration code or a fuse calibration code, the auto calibration code being generated based on the first up/down signal; and obtain, from an external test device, the fuse calibration code, the fuse calibration code having been generated based on the first up/down signal and the second up/down signal.

2. The buffer die of claim 1, wherein the write strobe signal generation circuit comprises:

a source clock generator configured to output, as a source clock signal, at least one of a first source clock signal or a second source clock signal based on a first selection signal, the first source clock signal having a first frequency and the second source clock signal having a second frequency smaller than the first frequency;

a phase splitter configured to generate a first split clock signal and a second split clock signal by splitting a phase of the source clock signal;

a selective flip circuit configured to output, as a first selected strobe signal, at least one of the first split clock signal or the second split clock signal, and output, as a second selected strobe signal, a remaining one of the at least one of the first split clock signal or the second split clock signal, based on a second selection signal indicating whether flipping is activated; and an amplifier configured to output the first write strobe signal and the second write strobe signal by amplifying the first selected strobe signal and the second selected strobe signal.

3. The buffer die of claim 2, wherein the selective flip circuit is further configured to:

output, based on the second selection signal indicating that the flipping is deactivated, the first split clock signal and the second split clock signal as the first selected strobe signal and the second selected strobe signal, respectively; and output, based on the second selection signal indicating that the flipping is activated, the first split clock signal and the second split clock signal as the second selected strobe signal and the first selected strobe signal, respectively.

4. The buffer die of claim 2, wherein the trimming circuit is further configured to:

cancel an offset of the write strobe signal generation circuit by activating the flipping; and generate the auto calibration code by averaging a first auto calibration code obtained based on the flipping being deactivated and a second auto calibration code obtained based on the flipping being activated.

5. The buffer die of claim 1, wherein the dividing and converting circuit comprises:

a clock division circuit configured to:

generate a first divided strobe signal and a third divided strobe signal having a fourth phase difference of 180 degrees from the first divided strobe signal by dividing a first frequency of the first write strobe signal; and generate a second divided strobe signal and a fourth divided strobe signal having a fifth phase difference of 180 degrees from the second divided strobe signal by dividing a second frequency of the second write strobe signal;

a current mode logic (CML) driver configured to generate a plurality of intermediate clock signals having a CML level by driving the first divided strobe signal, the second divided strobe signal, the third divided strobe signal, and the fourth divided strobe signal; and a CML to complementary metal-oxide semiconductor (CMOS) converter configured to generate the plurality of divided clock signals having a CMOS level based on the plurality of intermediate clock signals.

6. The buffer die of claim 5, wherein the clock division circuit comprises:

a first clock divider configured to generate the first divided strobe signal and the third divided strobe signal by dividing the first frequency of the first write strobe signal; and a second clock divider configured to generate the second divided strobe signal and the fourth divided strobe signal by dividing the second frequency of the second write strobe signal.

7. The buffer die of claim 1, wherein the duty cycle adjusting circuit comprises:

a first duty cycle adjuster configured to generate the first adjusted clock signal by adjusting a first delay amount of at least one of a first rising edge or a first falling edge of the first divided clock signal based on the first control code set;

a second duty cycle adjuster configured to generate the second adjusted clock signal by adjusting a second delay amount of at least one of a second rising edge or a second falling edge of the second divided clock signal based on the second control code set;

a third duty cycle adjuster configured to generate the third adjusted clock signal by adjusting a third delay amount of at least one of a third rising edge or a third falling edge of the third divided clock signal based on the third control code set; and a fourth duty cycle adjuster configured to generate the fourth adjusted clock signal by adjusting a fourth delay amount of at least one of a fourth rising edge or a fourth falling edge of the fourth divided clock signal based on the fourth control code set.

8. The buffer die of claim 7, wherein each of the first duty cycle adjuster, the second duty cycle adjuster, the third duty cycle adjuster, and the fourth duty cycle adjuster comprises:

a plurality of inverters coupled to each other in series;

a plurality of first delay cells coupled between adjacent inverters of the plurality of inverters; and a second delay cell coupled to an output of a last inverter from among the plurality of inverters.

9. The buffer die of claim 8, wherein each of the plurality of first delay cells comprises:

a first metal-oxide semiconductor (MOS) capacitor coupled to a power supply voltage;

a second MOS capacitor coupled to a ground voltage;

a p-channel metal-oxide semiconductor (PMOS) transistor comprising:

a first source coupled to a first gate of the first MOS transistor;

a first drain coupled to a first node; and a second gate configured to receive an inverted version of a corresponding bit of the first control code set; and a n-channel metal-oxide semiconductor (NMOS) transistor comprising:

a second drain coupled to the first node;

a third gate configured to receive the corresponding bit of the first control code set; and a second source coupled to a fourth gate of the second MOS capacitor, wherein an output of a first inverter of the plurality of inverters and an input of a second inverter of the plurality of inverters are commonly coupled to the first node, wherein the first inverter and the second inverter are adjacent inverters from among the plurality of inverters, and wherein the first source of the PMOS transistor and the second source of the NMOS transistor are coupled to each other.

10. The buffer die of claim 8, wherein the second delay cell comprises:

a first metal-oxide semiconductor (MOS) capacitor coupled to a power supply voltage;

a second MOS capacitor coupled to a ground voltage;

a p-channel metal-oxide semiconductor (PMOS) transistor comprising:

a first source coupled to a first gate of the first MOS transistor;

a first drain coupled to an output node coupled to the output of the last inverter; and a third gate configured to receive an inverted version of a corresponding bit of the first control code set; and a n-channel metal-oxide semiconductor (NMOS) transistor comprising:

a second drain coupled to the output node;

a fourth gate configured to receive the corresponding bit of the first control code set; and a second source coupled to a second gate of the second MOS capacitor, and wherein the first source of the PMOS transistor and the second source of the NMOS transistor are coupled to each other.

11. The buffer die of claim 1, wherein the read strobe signal generation circuit comprises:

a first multiplexer configured to sequentially select first bits of the first predetermined pattern data at respective first rising edges of the plurality of read clock signals;

a first driver configured to output the first read strobe signal by driving an output of the first multiplexer;

a second multiplexer configured to sequentially select second bits of the second predetermined pattern data at respective second rising edges of the plurality of read clock signals; and a second driver configured to output the second read strobe signal by driving an output of the second multiplexer, wherein each bit of the first predetermined pattern data is complementary with a respective bit of the second predetermined pattern data, and wherein a first frequency of the first read strobe signal is two times greater than a second frequency of the second read strobe signal.

12. The buffer die of claim 1, wherein the skew monitoring circuit comprises:

a first duty cycle monitor configured to generate the first up/down signal by the monitoring of the first duty cycle of the first read strobe signal and the second duty cycle of the second read strobe signal; and a first code storage configured to store the first up/down signal and the second up/down signal by accumulating the first up/down signal and the second up/down signal.

13. The buffer die of claim 12, wherein the trimming circuit comprises:

a second duty cycle monitor configured to generate the second up/down signal by the monitoring of the duty cycles of the plurality of read clock signals;

an auto calibration logic configured to:

generate the auto calibration code based on the first up/down signal;

generate a first selection signal and a second selection signal;

generate an auto calibration enable signal; and provide, to the write strobe signal generation circuit, the first selection signal and the second selection signal;

a second code storage configured to store the fuse calibration code; and a delay controller configured to:

select a calibration code from at least one of the auto calibration code or the fuse calibration code based on the auto calibration enable signal; and generate the plurality of control code sets based on the selected calibration code.

14. The buffer die of claim 13, wherein the trimming circuit is further configured to:

read, from the first code storage, the first up/down signal and the second up/down signal; and store the fuse calibration code in the second code storage based on the first up/down signal and the second up/down signal.

15. The buffer die of claim 13, wherein the delay controller comprises:

a first multiplexer configured to output a first selected calibration code by selecting at least one of a first auto sub-code of the auto calibration code or a first fuse sub-code of the fuse calibration code based on the auto calibration enable signal;

a first decoder configured to generate the first control code set by decoding the first selected calibration code;

a second multiplexer configured to output a second selected calibration code by selecting at least one of a second auto sub-code of the auto calibration code or a second fuse sub-code of the fuse calibration code based on the auto calibration enable signal;

a second decoder configured to generate the second control code set by decoding the second selected calibration code;

a third multiplexer configured to output a third selected calibration code by selecting at least one of a third auto sub-code of the auto calibration code or a third fuse sub-code of the fuse calibration code based on the auto calibration enable signal;

a third decoder configured to generate the third control code set by decoding the third selected calibration code;

a fourth multiplexer configured to output a fourth selected calibration code by selecting at least one of a fourth auto sub-code of the auto calibration code or a fourth fuse sub-code of the fuse calibration code based on the auto calibration enable signal; and a fourth decoder configured to generate the fourth control code set by decoding the fourth selected calibration code.

16. The buffer die of claim 15, wherein the first decoder is further configured to:

decode the first selected calibration code such that a number of bits having a logic high level in the first control code set is sequentially increased or decreased from a default value.

17. A stacked memory device, comprising:

a buffer die comprising an interface circuit configured to communicate with an external host device; and a plurality of core dies stacked on the buffer die and being coupled to the buffer die through a plurality of through silicon vias (TSVs), wherein the interface circuit is configured to receive, from the external host device, a first write strobe signal and a second write strobe signal having a first phase difference of 180 degrees from the first write strobe signal, wherein the interface circuit comprises:

a dividing and converting circuit configured to generate a plurality of divided clock signals comprising a first divided clock signal, a second divided clock signal, a third divided clock signal, and a fourth divided clock signal, the plurality of divided clock signals having a second phase difference of 90 degrees with respect to each other, the generating of the plurality of divided clock signals comprising dividing the first write strobe signal and a second write strobe signal, and converting one or more levels of the divided write strobe signals;

a duty cycle adjusting circuit configured to generate a plurality of adjusted clock signals comprising a first adjusted clock signal, a second adjusted clock signal, a third adjusted clock signal, and a fourth adjusted clock signal, the generating of the plurality of adjusted clock signals comprising adjusting a duty cycle of each of the plurality of divided clock signals based on a corresponding control code set of a plurality of control code sets comprising a first control code set, a second control code set, a third control code set, and a fourth control code set;

a read strobe signal generation circuit configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree;

a skew monitoring circuit configured to generate a first up/down signal by monitoring a first duty cycle of the first read strobe signal and a second duty cycle of the second read strobe signal; and a trimming circuit configured to:

generate a second up/down signal by monitoring duty cycles of the plurality of read clock signals; and generate the plurality of control code sets based on at least one of an auto calibration code or a fuse calibration code, the auto calibration code being generated based on the first up/down signal, wherein the fuse calibration code is input from an external test device and is stored inside of the trimming circuit based on a wafer level test being performed on the buffer die.

18. The stacked memory device of claim 17, wherein the trimming circuit comprises:

a second duty cycle monitor configured to generate the second up/down signal by the monitoring of the duty cycles of the plurality of read clock signals;

an auto calibration logic configured to:

generate the auto calibration code based on the first up/down signal;

generate a first selection signal and a second selection signal;

generate an auto calibration enable signal; and provide, to the write strobe signal generation circuit, the first selection signal and the second selection signal;

a second code storage configured to store the fuse calibration code; and a delay controller configured to:

select at least one of the auto calibration code or the fuse calibration code based on the auto calibration enable signal; and generate the generate the plurality of control code sets based on the selected calibration code.

19. The stacked memory device of claim 17, wherein the interface circuit is configured to:

generate an internal command based on a command received from a memory controller in the external host device;

provide the internal command to a target core die from among the plurality of core dies through a first TSV from among the plurality of TSVs; and provide data to the target core die through a second TSV from among the plurality of TSVs, wherein each of the plurality of core dies comprises:

a memory cell array comprising a plurality of volatile memory cells coupled to a plurality of word lines and a plurality of bit lines and storing the data; and a command decoder configured to control access to the memory cell array based on the internal command.

20. A buffer die provided in a wafer, the buffer die comprising:

a write strobe signal generation circuit configured to, based on being enabled in a wafer level test on the buffer die, generate a first write strobe signal and a second write strobe signal having a first phase difference of 180 degrees from the first write strobe signal;

a dividing and converting circuit configured to generate a plurality of divided clock signals comprising a first divided clock signal, a second divided clock signal, a third divided clock signal, and a fourth divided clock signal, the plurality of divided clock signals having a second phase difference of 90 degrees with respect to each other, the generating of the plurality of divided clock signals comprising dividing the first write strobe signal and the second write strobe signal, and converting one or more levels of the divided write strobe signals;

a duty cycle adjusting circuit configured to generate a plurality of adjusted clock signals comprising a first adjusted clock signal, a second adjusted clock signal, a third adjusted clock signal, and a fourth adjusted clock signal, the generating of the plurality of adjusted clock signals comprising adjusting a duty cycle of each of the plurality of divided clock signals based on a corresponding control code set of a plurality of control code sets comprising a first control code set, a second control code set, a third control code set, and a fourth control code set;

a read strobe signal generation circuit configured to generate a first read strobe signal and a second read strobe signal having a third phase difference of 180 degrees from the first read strobe signal, based on a first predetermined pattern data, a second predetermined pattern data and a plurality of read clock signals obtained by passing the plurality of adjusted clock signals through a clock tree;

a skew monitoring circuit configured to generate a first up/down signal by monitoring a first duty cycle of the first read strobe signal and a second duty cycle of the second read strobe signal; and a trimming circuit configured to:

generate a second up/down signal by monitoring duty cycles of the plurality of read clock signals;

generate the plurality of control code sets based on at least one of an auto calibration code or a fuse calibration code, the auto calibration code being generated based on the first up/down signal;

obtain, from an external test device, the fuse calibration code, the fuse calibration code having been generated based on the first up/down signal and the second up/down signal;

cancel an offset of the write strobe signal generation circuit by activating a flipping; and generate the auto calibration code by averaging a first auto calibration code obtained based on the flipping being deactivated and a second auto calibration code obtained based on the flipping being activated.

* * * * *